(12) United States Patent
Makino

(10) Patent No.: US 7,809,038 B2
(45) Date of Patent: Oct. 5, 2010

(54) ELECTRO-ABSORPTION OPTICAL MODULATOR INTEGRATED WITH A LASER TO PRODUCE HIGH SPEED, UNCOOLED, LONG DISTANCE, LOW POWER, 1550 NM OPTICAL COMMUNICATION DEVICE WITH OPTIMIZED PARAMETERS

(75) Inventor: Shigeki Makino, Kokubunji (JP)

(73) Assignee: Opnext Japan, Inc., Yokohama-shi, Kanagawa (JP)

( * ) Notice: Subject to any disclaimer, the term of this patent is extended or adjusted under 35 U.S.C. 154(b) by 404 days.

(21) Appl. No.: 11/481,918

(22) Filed: Jul. 7, 2006

(65) Prior Publication Data

US 2007/0235715 A1   Oct. 11, 2007

(30) Foreign Application Priority Data

Apr. 7, 2006   (JP) .............................. 2006-105932

(51) Int. Cl.
*H01S 3/04* (2006.01)
*H01S 5/00* (2006.01)

(52) U.S. Cl. .............................. 372/45.012; 372/43.01; 372/44.01; 372/50.1; 372/50.11

(58) Field of Classification Search .................. 332/112; 359/279, 248; 257/14; 372/45.012, 50.11, 372/501, 44.01, 43.01, 50.1

See application file for complete search history.

(56) References Cited

U.S. PATENT DOCUMENTS 5,882,951 A * 3/1999 Bhat ............................ 438/40

(Continued)

FOREIGN PATENT DOCUMENTS

JP   2003-29222   1/2003

(Continued)

OTHER PUBLICATIONS

Arimoto, H.; Shimizu, J.; Shirai, M.; Aoki, M., "Wide temperature range, from 0 to 85°C, operation of a 1.55 μm, 40 Gbit/s InGaAlAs electro-absorption optical modulator," Electronics Letters, vol. 41, No. 1, pp. 35-37, Jan. 6, 2005.*

(Continued)

*Primary Examiner*—Phat X Cao
*Assistant Examiner*—Diana C Garrity
(74) *Attorney, Agent, or Firm*—Mattingly & Malur, P.C.

(57) ABSTRACT

In a conventional EA/DFB laser, since the temperature dependence of the operation wavelength of the EA portion is substantially different from that of the DFB portion, the temperature range over which a stable operation is possible is small. In the case of using the EA/DFB laser as a light emission device, an uncooled operation is not possible. An EA/DFB laser which does not require a temperature control mechanism is proposed.

A quantum well structure in which a well layer made of any one of InGaAlAs, InGaAsP, and InGaAs, and a barrier layer made of either one of InGaAlAs or InAlAs is used for an optical absorption layer of an EA modulator. By properly determining detuning at a temperature of 25° C. and a composition wavelength of the barrier layer in the quantum well structure used for the optical absorption layer, it can be realized to suppress the insertion loss, maintain the extinction ratio, and reduce chirping simultaneously over a wide temperature range from −5° C. to 80° C.

19 Claims, 12 Drawing Sheets

U.S. PATENT DOCUMENTS

| | | | |
|---|---|---|---|
| 2004/0179569 A1* | 9/2004 | Sato et al. | 372/50 |
| 2004/0258119 A1* | 12/2004 | Shams-Zadeh-Amiri et al. | 372/45 |
| 2007/0104242 A1* | 5/2007 | Kudo et al. | 372/96 |
| 2007/0189344 A1* | 8/2007 | Sato et al. | 372/26 |

FOREIGN PATENT DOCUMENTS

| | | |
|---|---|---|
| JP | 2005-353910 | 12/2005 |

OTHER PUBLICATIONS

Makino, S.; Shinoda, K.; Kitatani, T.; Tsuchiya, T.; Aoki, M., "Wide temperature range (0 to 85°C), 40-km SMF transmission of a 1.55 µm, 10-Gbit/s InGaAlAs electroabsorption modulator integrated DFB laser," Optical Fiber Communication Conference, 2005. Technical Digest. OFC/NFOEC, vol. 6, no., pp. 3 pp. vol. 5-, Mar. 6-11, 2005.*

Shimizu, J.; Aoki, M.; Tsuchiya, T.; Shirai, M.; Taike, A.; Ohtoshi, T.; Tsuji, S., "Advantages of optical modulators with InGaAlAs/InGaAlAs MQW structure," Electronics Letters, vol. 38, No. 15, pp. 821-822, Jul. 18, 2002.*

Yoshida et al. (Yoshida, S.; Tada, Y.; Kotaka, I.; Wakita, K., "InGaAlAs/InAlAs multiquantum well electroabsorption phase modulator module," Electronics Letters, vol. 30, No. 21, pp. 1795-1796, Oct. 13, 1994.*

K. Nakahara et al, "115°C, 12.5-Gb/s direct modulation of 1.3-µm InGaAlAs-MQW RWG DFB laser with notch-free grating structure for datacom applications", Optical Fiber Communications Conference, 2003, OFC 2003, Mar. 3-28, 2003, pp. PD4O-P1-3.

M.R. Gokhale et al, Uncooled, 10 Gb/s 1310 nm Electroabsorption Modulated Laser, Post-deadline paper (PO-42) OFC 2003.

H. Chida et al, 10-GB.s—23 km Penalty-free Operation of 1.3-µm Uncooled EML by narrow-strip selective MOVPE, 30th ECOC 2004.

J. Zhang et al, Laser integrated modulator module for uncooled, 10 Gbit/s 1550 nm long-reach data transmission, Electronics Letters, 2003.

H. Debregeas-Sillard et al, Low-cost Coolerless 10GB/s Integrated Laser-Modulator, Optical Fiber Communication ThD4.

* cited by examiner

TEMPERATURE DEPENDENCE OF THE GAIN PEAK WAVELENGTH $\lambda_{EA}$ OF THE EA MODULATION DEVICE AND THE OSCILLATION WAVELENGTH $\lambda_{signal}$ OF THE DFB LASER DEPENDENCE OF THE INSERTION LOSS BASED ON THE FUNDAMENTAL ABSORPTION EDGE WAVELENGTH AT A TEMPERATURE OF 85°C WHICH IS THE UPPER LIMIT OF THE OPERATION TEMPERATURE DETUNING @25°C (nm)

DEPENDENCE OF THE INSERTION LOSS BASED ON THE DETUNING CORRESPONDING TO THE EXTINCTION RATIO AT A TEMPERATURE OF -5°C WHICH IS THE LOWER LIMIT OF THE OPERATION TEMPERATURE IN THE EA/DFB LASER

OPTIMAL RANGE OF THE GAIN PEAK WAVELENGTH OF THE EA
MODULATION DEVICE CORRESPONDING TO A SIGNAL LIGHT
WAVELENGTH OF A DFB LASER

FIG.4A

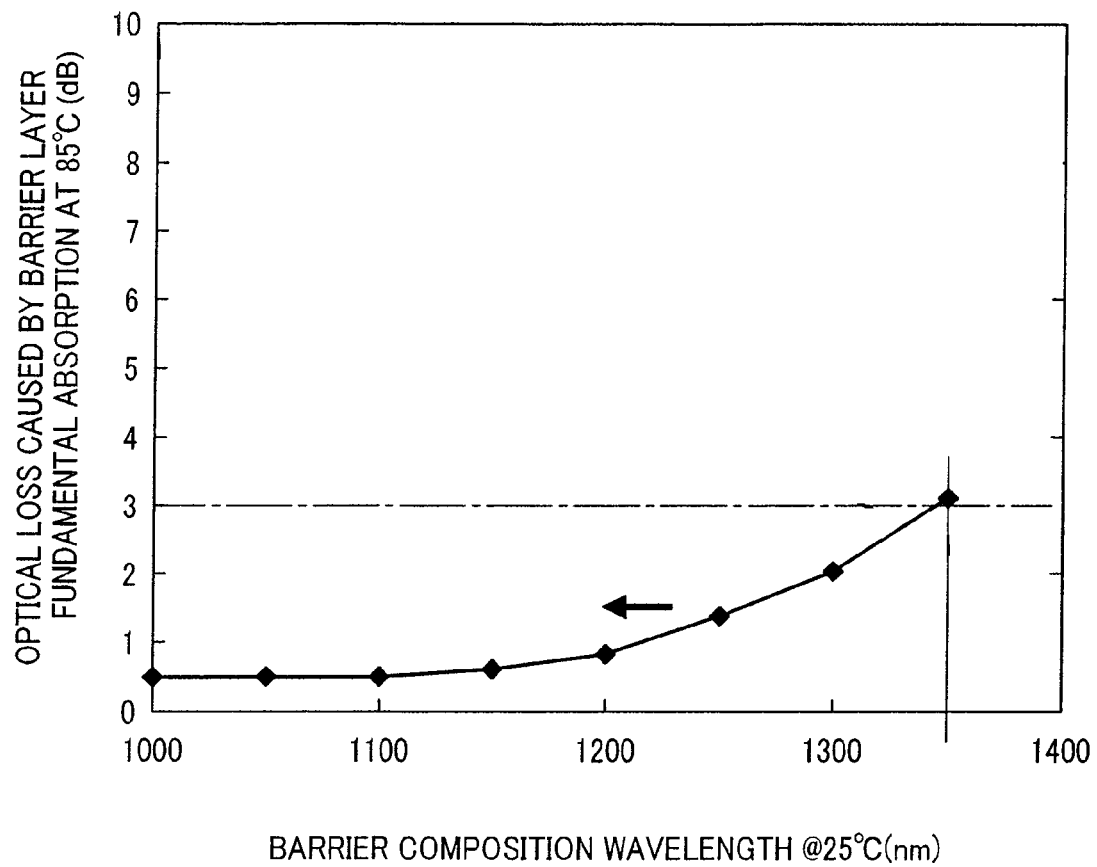

DEPENDENCE OF THE CONTRIBUTION TO THE INSERTION LOSS BASED ON THE OPTICAL ABSORPTION OF A BARRIER LAYER AT A TEMPERATURE OF 85°C WHICH IS THE UPPER LIMIT OF AN OPERATION TEMPERATURE OF A QUANTUM WELL STRUCTURE USED AS AN ABSORPTION LAYER OF AN EA MODULATION DEVICE AND THE COMPOSITION WAVELENGTH OF THE BARRIER LAYER AT A TEMPERATURE OF 25°C WITH AN ENERGY BAND OFFSET ON THE SIDE OF THE VALENCE BAND BETWEEN THE QUANTUM WELL AND THE BARRIER LAYER IN THE EA/DFB LASER

FIG.4B

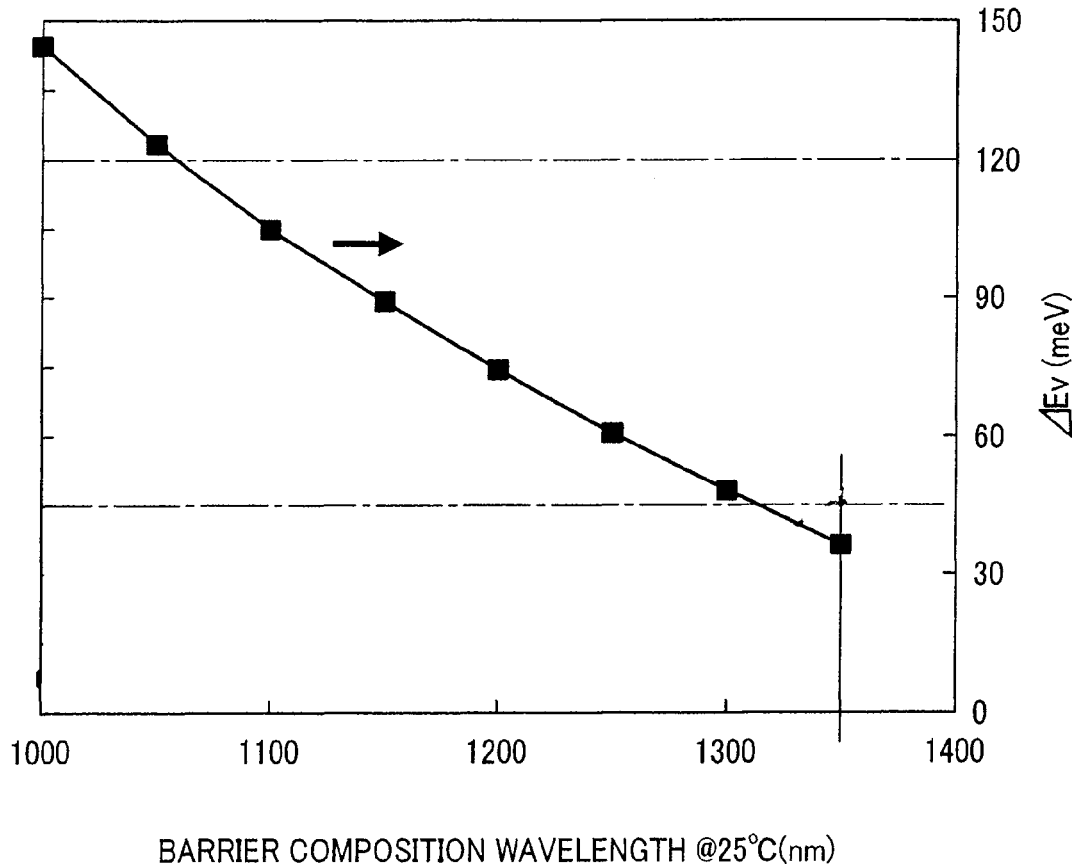

BARRIER COMPOSITION WAVELENGTH @25°C(nm)

DEPENDENCE OF THE CONTRIBUTION TO THE INSERTION LOSS BASED ON THE OPTICAL ABSORPTION OF A BARRIER LAYER AT A TEMPERATURE OF 85°C WHICH IS THE UPPER LIMIT OF AN OPERATION TEMPERATURE OF A QUANTUM WELL STRUCTURE USED AS AN ABSORPTION LAYER OF AN EA MODULATION DEVICE AND THE COMPOSITION WAVELENGTH OF THE BARRIER LAYER AT A TEMPERATURE OF 25°C WITH AN ENERGY BAND OFFSET ON THE SIDE OF THE VALENCE BAND BETWEEN THE QUANTUM WELL AND THE BARRIER LAYER IN THE EA/DFB LASER

ELECTRO-ABSORPTION OPTICAL MODULATOR INTEGRATED WITH A LASER TO PRODUCE HIGH SPEED, UNCOOLED, LONG DISTANCE, LOW POWER, 1550 NM OPTICAL COMMUNICATION DEVICE WITH OPTIMIZED PARAMETERS

CLAIM OF PRIORITY

The present invention application claims priority from Japanese application JP 2006-105932 filed on Apr. 7, 2006 the content of which is hereby incorporated by reference into this application.

FIELD OF THE INVENTION

The present invention relates to a semiconductor optical modulation device and an integrated semiconductor light emission device integrating the same.

BACKGROUND OF THE INVENTION

With the proliferation of broad band networks, the trend of increasing the communication speed to 10 Gbit/s or higher has been accelerated in metropolitan optical communication networks connecting cities and relay stations. In the metropolitan optical communication networks, a fiber transmission distance of 40 to 80 km has been demanded for long distance transmission. In an optical communication system for the metropolitan optical communication network, it is an important subject to reduce the size and the power consumption of the optical transmitter/receiver module.

To reduce the size and the power consumption of the optical transmitter/receiver module, a system in which a temperature control mechanism for a light emission device is not required, i.e., an uncooled system is effective. For direct modulation systems for applying an electric signal directly to a semiconductor laser and generating a light signal, materials resistant to temperature changes have been selected, and heat dissipation of device structures has been improved. As disclosed in Non-Patent Document 1 (Optical Fiber Communication Conference 2003, PD40), for example, an uncooled high speed operation of 10 Gbit/s has been attained at an operation temperature of 100° C. or higher.

In the direct modulation system described above, however, the time fluctuation of a signal light wavelength (hereinafter referred to as chirping) is large in the high speed modulation operation at a modulation speed, for example, of 10 Gbit/s or higher. Thus, a 1300 nm band with small dispersion in optical fibers has been mainly used for the signal light wavelength band. In the signal light wavelength band of 1300 nm, however, the propagation loss in the optical fiber is large. This is not suitable for long distance transmission of 30 km or more.

Generally, to transmit a high speed light signal at a modulation rate of 10 Gbit/s or more for 40 km or more, an external modulation system in which only small chirping is generated is used. Particularly, a semiconductor electro-absorption (EA) modulation device utilizing the electro-absorption effect has excellent features with respect to reduction in size, power consumption, integration ability with a semiconductor laser, etc. Particularly, a semiconductor optical integrated device in which the EA modulation device and a distributed feedback (DFB) semiconductor laser with an excellent single-wavelength property are monolithically integrated on one semiconductor substrate (hereinafter referred to as EA/DFB laser) has been used generally as a long distance transmitting light emission device for transmission over the distance of 40 km or more. In this case, the signal light wavelength of a 1550 nm band with a small transmission loss of optical fibers has been mainly used.

In order to decrease the size and the power consumption of the optical communication module for the metropolitan optical communication network, it is desirable that the EA/DFB laser be uncooled in a similar manner to the direct modulation system. For the conventional EA/DFB laser, however, a temperature control function is required for the normal operation, and an uncooled operation is impossible. The reason will be described with the operation principle of the EA modulation device.

For the normal operation of the EA/DFB laser, it is important to appropriately set a detuning ($\lambda_{signal}-\lambda_{EA}$) defined as a difference between a signal light wavelength $\lambda_{signal}$ of the laser and a gain peak wavelength $\lambda_{EA}$ of the EA modulation device. In a state where a voltage is not applied to the EA modulation device, the optical absorption edge wavelength of the EA modulation device is sufficiently separated from the signal light wavelength so that an optical absorption does not occur. That is, the EA modulation device is transparent to the signal light. In this case, the signal light permeates the EA modulation device and is in an ON state as the optical output. When a voltage is applied to the EA modulation device, on the other hand, the optical absorption edge wavelength of the EA modulation device shifts toward the long wavelength side through the Franz-Keldysh effect or the quantum confine Stark effect to overlap with the signal light wavelength. In this case, the signal light is absorbed to the EA modulation device and the optical output is in an OFF state.

The light intensity ratio of the ON state and the OFF state of the signal light passing through the EA modulation device and flowing out is referred to as an extinction ratio. The larger the extinction ratio is, the more it is preferred for signal transmission without an error. A high speed light signal can be generated by modulating the voltage applied to the EA modulation device at a high speed.

In the operation principle of the EA modulation device, if the detuning is excessively small, the optical absorption edge wavelength of the EA modulation device is always overlapped with the signal light wavelength. As a result, the insertion loss increases due to the increase in the fundamental absorption, whereby a sufficient optical output cannot be obtained in the ON state of the light signal to increase the bit error rate after transmission. On the other hand, in the case where the detuning is excessively large, an application voltage increases, which is required till the optical absorption edge wavelength of the EA modulation device is overlapped with the signal light wavelength. This is not suitable for a low power consumption operation. Further, in the case where the voltage applied to the FA modulation device is excessively high, wave functions of carriers leak from the quantum well, resulting in a problem of deteriorating the extinction ratio.

The detuning in the EA/DFB laser needs to be set such that the signal light is not absorbed in the ON state in which the electric field is not applied, and extinction can be sufficiently attained within a practical range of the voltage in the OFF state in which the signal light is absorbed.

On the other hand, the light emission device is demanded to normally operate at an operation temperature between −5° C. and 85° C., the light emission device being used for an optical communication module for small, low consumption power communications for the metropolitan optical communication network. However, the detuning of the EA modulation device largely varies depending on the operation temperature. This will be described with reference to FIG. 1.

FIG. 1 shows the temperature dependence of the gain peak wavelength $\lambda_{EA}$ in an extent EA modulation device with a broken line and the temperature dependence of the oscillation $\lambda_{signal}$ in DFB laser with a solid line. The temperature dependence of $\lambda_{EA}$ is related to the temperature dependence of the semiconductor band gap which is about +0.65 nm/° C. On the other hand, the temperature dependence of $\lambda_{signal}$ is related to the temperature dependence of the diffraction grating, which is about +0.1 nm/° C. Thus, the temperature dependence of the change of the detuning as the difference between them is about +0.55 nm/° C., and the detuning changes by about 50 nm upon the temperature change from −5° C. to 85° C. In the conventional EA/DFB laser, the fluctuation range for the detuning in which the normal operation is possible is about ±5 nm, and temperature control is applied so as to provide a predetermined characteristic, for example, at a temperature of 25° C.

Since the detuning of the EA/DFB laser, as described above, changes as much as about 50 nm, it greatly exceeds ±5 nm, which is the fluctuation range for the detuning in which the normal operation is possible. The optical loss increases at high temperature, making it difficult for ensuring the intensity of light sufficient for long distance transmission.

For solving the problem of the change of the detuning by temperature described above and attaining the uncooled system for the ED/DFB laser, the EA modulation device is set as shown by a dotted chain $\lambda'_{EA}$ in FIG. 1 such that the detuning has an appropriate value at an estimated highest working temperature, for example, at a temperature of 85° C. At a working temperature lower than the estimated highest working temperature, it is possible to adopt a method of applying an offset bias $V_{OH}$ to EA modulation device in accordance with the temperature change, thereby shifting the optical absorption edge wavelength of the EA modulation device and controlling it so as to always keep an appropriate detuning even when the working temperature changes. Known examples of the uncooled EA/DFB using the method include, for example, those described in Non-Patent Document 2 (Optical Fiber Communication conference 2003, PD 42) or Non-Patent Document 3 (30$^{th}$ ECOC 2004, Mo 4.4.7).

In the Non-Patent Documents 2, 3, a signal light wavelength in a 1300 nm band is used. In the signal light wavelength in the 1300 nm band, the optical loss is large during transmission through an optical fiber. It is not suitable for long distance transmission for a distance of 20 km or more. For long distance transmission for a distance of 40 km or more necessary for the metropolitan optical communication network, it is desirable that the operation be possible in the 1550 nm band of the signal light wavelength with a small optical loss during fiber transmission. Known examples for an uncooled EA/DFB in the 1550 nm band suitable for a long distance communication include, for example, those described in Non-Patent Document 4 (Electronics Letters, 2003, Vol. 39, No. 259), or Non-Patent Document 5 (Optical Fiber Communication Conference 2004, ThD4).

In the Non-Patent Document 4, there is no specific description about detuning and about a semiconductor quantum well structure as an optical absorption layer. Further, the Non-Patent Document 5 discloses detuning of 55 nm at a temperature of 25° C. This is a value substantially identical with that in the existent EA/DFB laser. This value does not correspond to detuning suitable for the 1550 nm band which is preferred for the long distance communication proposed in the present invention.

[Non-Patent Document 1]: Optical Fiber Communication Conference 2003, PD40
[Non-Patent Document 2]: Optical Fiber Communication Conference 2003, PD44
[Non-Patent Document 3]: 30th ECOC 2004, Mo 4.4.7
[Non-Patent Document 4]: Electronics Letters, 2003, Vol. 39, No. 25
[Non-Patent Document 5]: Optical Fiber Communication Conference 2004, ThD4

SUMMARY OF THE INVENTION

The present invention provides a light emission device using an EA modulator having optimal detuning in the 1550 nm band and a quantum well structure suitable for a long distance optical communication for a distance of 40 km or more, thereby providing an inexpensive light source.

For the operation of the EA/DFB laser in the 1550 nm band of the signal light wavelength, trade off between the chirping and the extinction ratio needs to be considered. This is because the amount of the dispersion during fiber transmission in the 1300 nm band of the signal light wavelength is substantially zero, while the fiber dispersion is as large as about 20 ps/nm/km in the 1550 nm band. For the setting of the detuning assuming the uncooled operation, when the temperature becomes lower, the detuning becomes larger. The larger detuning is, the higher voltage is required for controlling the detuning to an appropriate detuning. In this case, the slanting of the band increases to decrease the confinement effect of carriers in the quantum well. As a result, a spatial overlap of the wave functions of electrons and holes is decreased to deteriorate the extinction ratio.

For ensuring the extinction ratio during an uncooled operation, it is necessary to strongly confine electrons with a small effective mass in the quantum well. For this purpose, it is effective to use, for example, a method of decreasing the well width of the quantum well to enhance the quantum effect or a method of increasing the difference between the composition wavelengths of the quantum well layer and the barrier layer to increase the energy band offset between both of them. However, using the methods described above means to increase chirping. The methods are not suitable for the operation in the 1550 nm band of the signal light wavelength.

In the conventional EA/DFB laser, a multi-quantum well at least including In, Ga, As, and P is generally used as the optical absorption layer. In the InGaAsP system quantum well described above, the trade off between the chirping and the extinction ratio is severe, as described above. The long distance transmission for a distance of 40 km or more by the uncooled operation is difficult to be attained. This is due to the feature in which, in the band structure of the InGaAsP material system, the energy band offset between the quantum well layer and the barrier layer is smaller on the side of the conduction band and larger on the side of the valance band. On the contrary, the quantum well structure in which the well layer is made of InGaAlAs, InGaAsP, or InGaAs, and the barrier layer is made of InGaAlAs or InAlAs has excellent features as described below and can be said suitable as an optical absorption layer of the EA modulation device aiming at an uncooled operation.

(1) The band offset on the side of the conduction band is large and the leakage of the wave function to the outside of the quantum well is small in the quantum well structure. Thus, a spatial overlap of wave functions of electrons and holes is large, and the extinction ratio is improved.
(2) The energy band offset between the quantum well and the barrier layer is smaller on the side of the valence band than on the side of the conduction band. Holes are hardly accumulated in the quantum well. Thus, since this is suitable for a high speed modulation operation and chirping during modulation is suppressed, this is advantageous for long distance transmission.

The inventors of the present application have experimentally proved that fiber transmission for a distance of 40 km at a modulation speed of 10 Gbit/s by an uncooled operation is possible by applying an InGaAlAs system material to the EA modulation device and setting an appropriate detuning in the EA/DFB laser aiming for the uncooled operation.

As has been described above, for the normal operation of the EA/DFB laser, it is important to set appropriate detuning. Setting of detuning suitable for the uncooled EA/DFB laser is described with reference to FIG. 2.

The abscissa shown in FIG. 2 represents detuning at a temperature of 25° C. The ordinate on the left represents an insertion loss based on the fundamental absorption edge wavelength at a temperature of 85° C. which is an upper limit for the assumed operation temperature. The ordinate on the right represents an extinction ratio at −5° C. which is a lower limit for the operation temperature. As the detuning at a temperature of 25° C. decreases, the insertion loss based on the fundamental absorption edge wavelength at a temperature of 85° C. which is the upper limit for the operation temperature increases. This is because detuning decreases at a temperature of 85° C. (refer to FIG. 1). When the detuning at a temperature of 25° C. decreases to 80 nm or less, the insertion loss based on the fundamental absorption edge wavelength at a temperature of 85° C. exceeds 5 dB. In principle, the EA modulation device has a modulation loss which is a loss during modulation, as well as the insertion loss. It is difficult to suppress the modulation loss to the value of 4 dB or less. In the case where the sum of the insertion loss and the modulation loss at a temperature of 85° C. is 9 dB or more, it requires a large current for the DFB laser in order to obtain an optical output during modulation, the optical output being necessary for performing long distance transmission for a distance of 40 km or more without a relay, which is not suitable for the operation at low power consumption. Thus, it is desirable to set the detuning at a temperature of 25° C. of the uncooled EA/DFB laser to 80 nm or more.

On the other hand, taking notice on the extinction ratio at −5° C. which is a lower limit of the operation temperature, the larger the detuning at a temperature of 25° C. of the EA/DFB laser, the lower the extinction ratio at −5° C. is. This is because detuning at −5° C. increases excessively (refer to FIG. 1). When the detuning at a temperature of 25° C. exceeds 120 nm, extinction ratio at −5° C. is reduced to less than 10 dB. Generally, for signal transmission without a signal error, 10 dB or more is necessary for the dynamic extinction ratio as an extinction ratio during high speed modulation. For this purpose, when considering the extinction ratio at a low temperature, it is desirable that detuning at a temperature of 25° C. be 120 nm or less.

From the experimental perspective described above, it is preferred that the detuning at a temperature of 25° C. suitable for the uncooled operation of the EA/DFB laser be preferably set between 80 nm and 120 nm. More generally, the following expression is shown by using the energy $E_{signal}$ corresponding to the signal light wavelength at a temperature of 25° C. and the energy $E_{EA}$ corresponding to the gain peak wavelength of the EA modulation device at a temperature of 25° C.: 40 meV$<(E_{EA}-E_{signal})<$70 meV FIG. 3 shows an optimal range of the detuning proposed by the invention in the case where the signal light wavelength at a room temperature (25° C.) is 1500 nm. In the case where the signal light wavelength at the room temperature is 1550 nm, the optimal gain peak wavelength of the EA modulation device according to the proposal of the invention is between 1430 nm and 1470 nm. This corresponds to a region shown by hatched lines in the figure. The signal light wavelength is not applied only to 1550 nm. Even in the case where the signal light wavelength is one of the values between 1450 nm and 1630 nm, the same relation as hereinabove described is established with respect to the detuning setting. In this case, the gain peak wavelength of the EA modulation device may be set to the value from 1340 nm to 1550 nm while considering the optimal detuning.

It has also been studied on the range of a composition wavelength suitable for the barrier layer in the quantum well structure at a temperature of 25° C., the barrier layer being used as an absorption layer of the EA modulation device of the uncooled EA/DFB laser, with respect to the trade off between the optical loss and the chirping at a high temperature. As shown in FIG. 4, the abscissa represents a compositional ratio of the barrier layer at a temperature of 25° C. FIG. 4 is based on the experimental data using an EA/DFB laser at the signal light wavelength of 1550 nm, and the gain peak wavelength of 1470 nm of the EA modulation device at a temperature of 25° C. The ordinate on the left represents a contribution to the insertion loss due to the optical absorption of the barrier layer at a temperature of 85° C. The ordinate on the right shows the energy band offset on the side of the valence band (hereinafter referred to as ΔEv) between the quantum well and the barrier layer.

As shown in FIG. 4, as the composition wavelength of the barrier layer at a temperature of 25° C. is longer, the contribution to the insertion loss due to the optical absorption effect of the barrier layer at a temperature of 85° C. increases. This is because that the composition wavelength of the barrier layer at a temperature of 85° C. becomes longer than the composition wavelength of the barrier layer at a temperature of 25° C. and approaches to the signal light wavelength due to the decrease in the band gap with the increase of the temperature. Further, as shown in FIG. 4, when the composition wavelength of the barrier layer at a temperature of 25° C. exceeds 1350 nm, the contribution to the insertion loss due to the optical absorption of the barrier layer at a temperature of 85° C. exceeds 3 dB. In this case, it is difficult to suppress the sum of the insertion loss and the modulation loss in the EA modulation device to the value of 9 dB or less. As a result, a large current is required for the DFB laser in order to obtain an optical output upon modulation necessary for performing long distance transmission for 40 km or more without a relay. This is not suitable for a low power consumption operation. Thus, the composition wavelength of the barrier layer at a temperature of 25° C. is preferably 1350 nm or less. More generally, the following expression is shown by using the energy $E_{signal}$ corresponding to the signal light wavelength and the energy $E_{barrier}$ corresponding to the compositional ratio of the barrier layer: $(E_{signal}+120$ meV$)<(E_{barrier})$ On the other hand, as the composition wavelength of the barrier layer at a temperature of 25° C. is shortened, the value of ΔEv increases. As ΔEv increases, a plurality of quantum levels are formed in the quantum well on the side of the valence band to increase the ratio of the fluctuation of the refractive index relative to the fluctuation of the carrier density. As a result, chirping increases so that this is not suitable for long distance transmission for a distance of 40 km or more. In order to suppress the chirping, it is desirable to decrease ΔEv as small as possible. In a state where a constant temperature is set, the EA modulation device uses the quantum well as the optical absorption layer, the quantum well including an InGaAsP system material, which attains the long distance transmission for a distance of 40 km at 10 Gbit/s. In the EA modulation layer, ΔEv is about 120 meV. In the quantum well structure made of the InGaAlAs system material, when ΔEv is set to 120 meV, the wavelength of the barrier layer at a temperature of 25° C. is 1050 nm relative to the gain peak wavelength of 1470 nm of the EA modulation device at a temperature of 25° C. Thus, it is desirable to set the compositional ratio of the barrier layer to 1050 nm or more when the gain peak wavelength of the EA modulation device at a temperature of 25° C. is 1470 nm, in the EA modulation device using the InGaAlAs system quantum well as the optical absorption layer. More generally, the following expression is shown by using the energy $E_{EA}$ corresponding to the gain peak wavelength of the EA modulation device at a temperature of 25° C. and the energy $E_{barrier}$ corresponding to the barrier composition wavelength at a temperature of 25° C.:

$$E_{barrier}<(E_{EA}+350\text{ meV})$$

From the consideration described above, as the setting for the quantum well barrier layer suitable for the uncooled operation of the EA/DFB laser aiming at long distance transmission for a distance of 40 km or more, it is preferably expressed below:

$$(E_{signal}+120\text{ meV})<E_{barrier}<(E_{EA}+350\text{ meV})$$

The signal light wavelength is not restricted to 1550 nm. However, even if the signal light wavelength is one of the values between 1450 nm and 1630 nm, the setting of composition wavelength of the barrier layer in the quantum well structure of the EA modulation device suitable for the uncooled operation of the EA/DFB laser, it can be easily estimated the same relation as hereinabove described is established.

In the experimental study described above, while the DFB laser is used as a light source for supplying a signal light to the EA modulation device, it may not necessarily be restricted to the DFB laser but a similar effect can be obtained also by a distributed Bragg reflector (DBR). Additionally, it is not always necessary that the EA modulation device and the light source for supplying the signal light are monolithically integrated. Also, in the case of using an external light source constituted so as to condense the signal light to the EA modulation device by using some means, a relation between the signal light wavelength and the detuning and the relation between the signal light and the barrier layer composition wavelength do not essentially change.

Further, in the above discussion, the uncooled operation of the EA/DFB laser is noted. In the case of using a variable wavelength light source capable of changing the wavelength of the signal light by some means as the light source for supplying the signal light, the relation between the signal light wavelength and the detuning or the relation between the signal light wavelength and the barrier layer composition wavelength do not essentially change.

There is a problem of the change of the detuning due to the change of temperature in the uncooled operation. However, in the case of using the variable wavelength laser for the light source supplying the signal light, the gain peak wavelength of the EA modulation device does not change. The detuning changes due to the change of the signal light wavelength. The longest oscillation wavelength of the variable wavelength laser is $\lambda_{signal}$. The gain peak wavelength of the EA modulation device at the operation temperature is $\lambda_{EA}$. With consideration of the trade off between the insertion loss during the operation of shortest wavelength of the variable wavelength laser and the extinction ratio during the operation of the longest wavelength, It can be easily considered that the following expression is desirable in the same manner as in the uncooled operation:

$$40\text{ meV}<(E_{EA}-E_{signal})<70\text{ meV}$$

$$(E_{signal}+120\text{ meV})<E_{barrier}<(E_{EA}+350\text{ meV})$$

BRIEF DESCRIPTION OF THE DRAWINGS

FIG. 4 is a graph showing an embodiment of the dependence of the contribution to the insertion loss based on the optical absorption of a barrier layer at a temperature of 85° C. which is an upper limit of an operation temperature of a quantum well structure used as an absorption layer of an EA modulation device (FIG. 4A) and the composition wavelength of the barrier layer at a temperature of 25° C. with an energy band offset on the side of the valence band between the quantum well and the barrier layer in the EA/DFB laser (FIG. 4B).

DESCRIPTION OF THE PREFERRED EMBODIMENT

According to the present invention, a semiconductor optical modulation device suitable for the uncooled operation can be realized. Further, by using the optical modulation device according to the present invention, a light emission device does not require a mechanism for controlling a device temperature due to integration with a single mode laser such as a DFB laser or DBR laser. The light emission device suitable for long distance transmission for a distance of 40 km or more can be manufactured at a low cost. Further, an optical device integrating with an optical modulation device, which supports a wide variable wavelength, can be attained by integration with a variable wavelength light source.

Embodiment 1

RWG-EA/DFB (DBR)

A process for manufacturing a semiconductor optical integrated device according to Embodiment 1 of the present invention is described with reference to FIG. 5 and FIG. 6. The drawings are only for the purpose of explaining the embodiment. The size and scale of the drawings showing the embodiment are not necessarily identical.

Figure 5A:
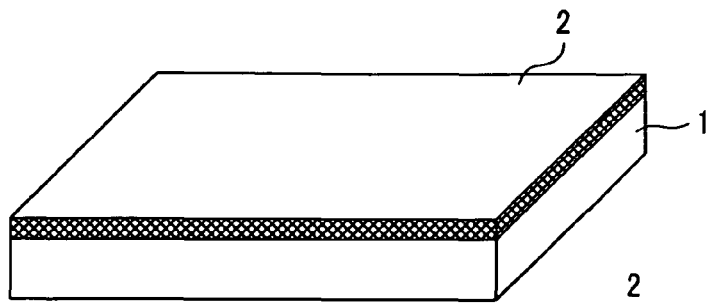
FIG. 5 is a view showing a former-half for the manufacturing step of a semiconductor optical integrated device according to Embodiment 1 of the present invention.
Figure 5B:
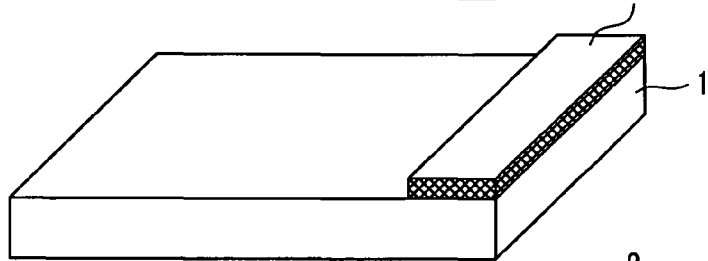

At first, a quantum well structure 2 made of an InGaAlAs system is formed on an n-InP substrate 1 as an electro-absorption optical modulator using an MOCVD method (FIG. 5A). In this case, a light emission wavelength of the quantum well structure at a temperature of 25° C. is about 1470 nm. For example, a desired light emission wavelength can be obtained by laminating a quantum well layer with a thickness of 6 nm and with a compositional ratio of In, Ga, and Al at 0.54:0.38:0.08, and a barrier layer with a thickness of 10 nm and with a compositional ratio of In, Ga, and Al at 0.52:0.33:0.15. Further, an optical confinement structure sufficient for extinction can be formed as the quantum well structure by alternately laminating about 10 layers of the quantum wells and the barrier layers. Then, etching is performed up to the surface of the n-InP substrate 1 while leaving the electro-absorption optical modulator of a desired length (FIG. 5B). The etching technique for the semiconductor layer having In, Ga, Al, and As is described in detail, for example, in JP-A No. 2005-150181.

Figure 5C:
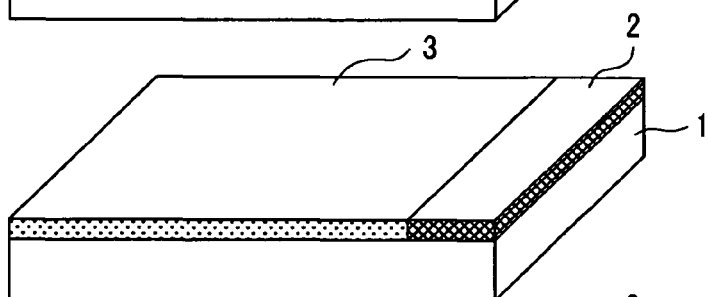
Figure 5D:
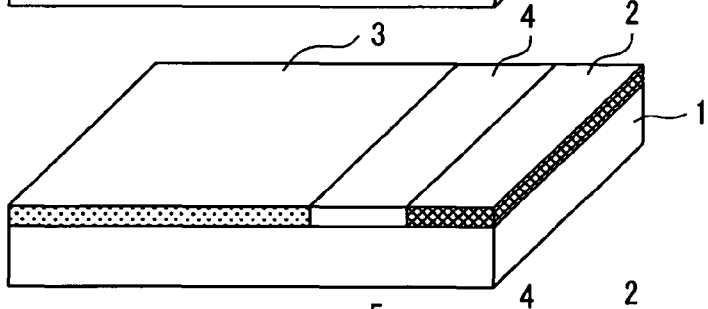

Then, a quantum well structure 3 made of an InGaAlAs system is formed as a semiconductor laser portion (FIG. 5C). The light emission wavelength of the quantum well structure 3 at a temperature of 25° C. is about 1540 nm. For example, a desired light emission wavelength can be obtained by laminating a quantum well layer with a thickness of 4 nm and with a compositional ratio of In, Ga, and Al at 0.65:0.3:0.05, and a barrier layer with a thickness of 10 nm and with a compositional ratio of In, Ga, and Al at 0.55:0.33:0.12.

Further, an optical confinement structure suitable for laser oscillation can be formed by alternately laminating about 8 layers of the quantum wells and the barrier layers. Although not illustrated, a carrier confinement structure suitable for laser oscillation can be formed by sandwiching the quantum well structure 3 between InAlAs bulk grown layers with a thickness of about 100 nm and with a compositional ratio of In and Al at 0.52:0.48.

Then, etching is performed up to the surface of the n-InP substrate 1 while leaving a semiconductor laser portion of a desired length so as not to influence the electro-absorption optical modulator described above. The etching technique is disclosed specifically in JP-A No. 2005-150181 as described above.

Then, an optical waveguide layer 4 made of an InGaAsP system is formed between the electro-absorption optical modulator and the semiconductor laser portion described above (FIG. 5D). As a detailed structure of the optical waveguide layer 4, for example, the following structure is desirable: an InGaAsP bulk growth layer with a thickness of 100 nm and with the composition wavelength of 1150 nm is formed, an InGaAsP growth layer with a thickness of 200 nm and with the composition wavelength of 1300 nm, and an InGaAsP bulk growth layer with a thickness of 100 nm and with the composition wavelength of 1150 nm are successively formed. An optical waveguide layer with a small optical loss can be formed by the structure described above.

Figure 5E:
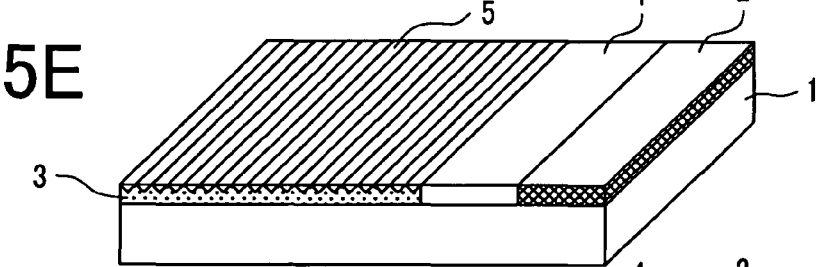

Then, a diffraction grating 5 is formed by etching on the quantum well structure 3 made of the InGaAlAs system as the semiconductor laser portion (FIG. 5E). As the diffraction grating layer, a semiconductor having a higher refractive index than that of InP is desired. For example, an InGaAsP growth layer with a thickness of 30 nm and with the composition wavelength of 1150 nm is preferred. In order to form the diffraction grating, a pattern formation to a resist using either a holographic exposure method or an electron beam drawing method, both of which are known techniques, and either of a wet or dry etching step may be combined. As a specific resist pattern, stripes at a pitch of about 240 nm may be formed in the direction perpendicular to mesa. This can provide a stable longitudinal single mode oscillation suitable for optical communications.

Figure 5F:
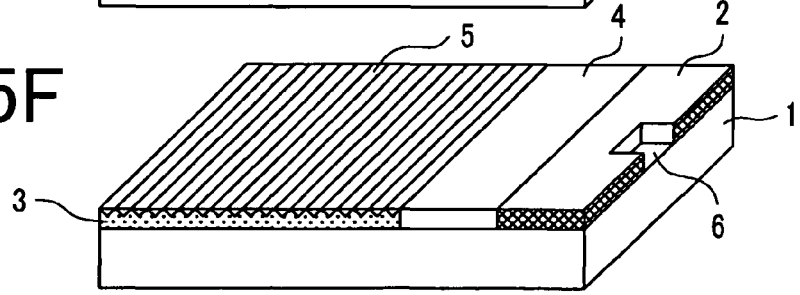

Then, a part of the side of a light emission edge of the quantum well structure 2 made of the InGaAlAs system, which is formed as the electro-absorption optical modulator described above, is etched to reach the n-InP substrate 1, forming a window structure 6 (FIG. 5F).

Figure 6A:
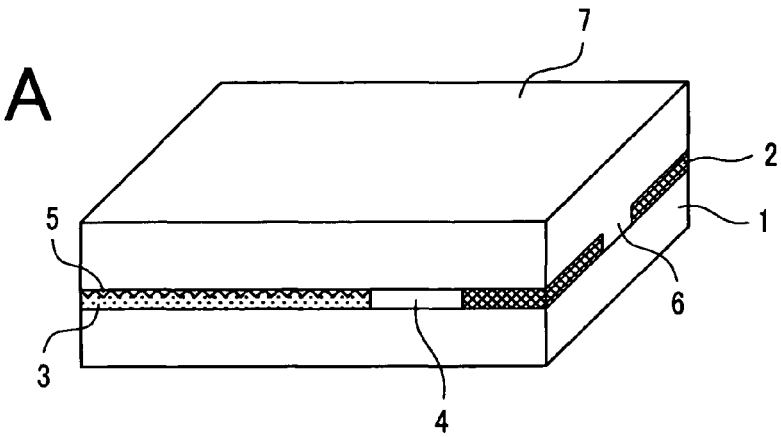
FIG. 6 is a view showing a latter-half for the manufacturing step of a semiconductor optical integrated device according to Embodiment 1 of the invention.
Figure 6B:
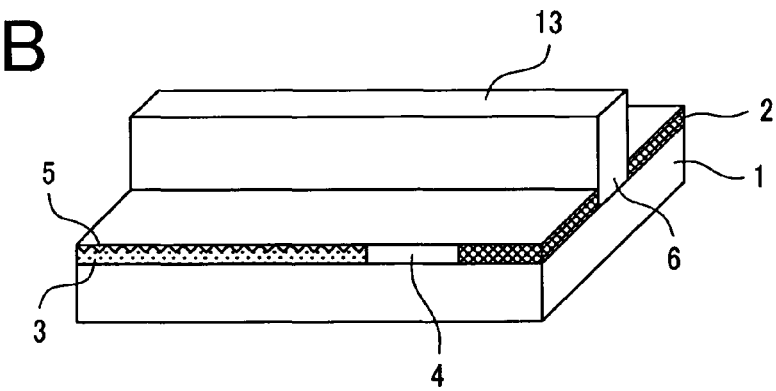
Figure 6C:
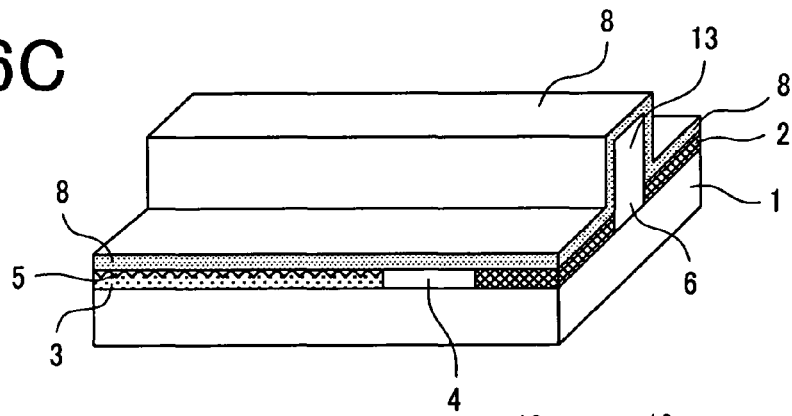
Figure 6D:
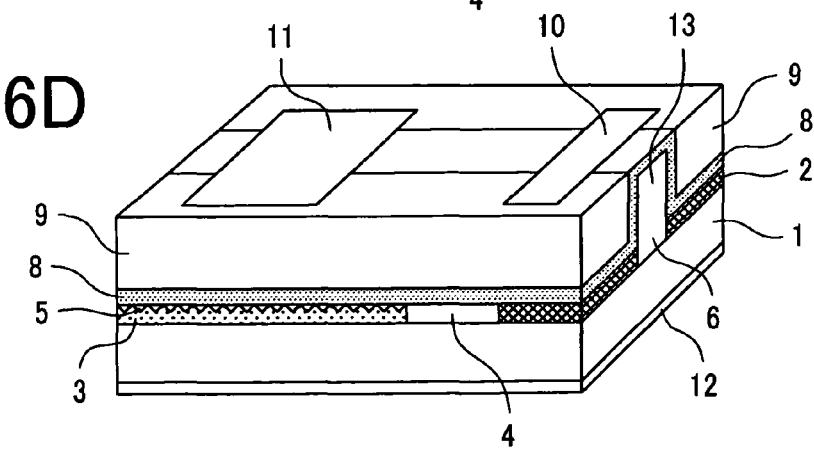

Successively, a p-InP layer 7 is formed by an MOCVD method (FIG. 6A). Then, except for the portion forming the ridged waveguide, the p-InP layer 7 is etched up to the surfaces of the quantum well structure 2, the quantum well structure 3 and the optical waveguide layer 4 in order to form a ridged waveguide structure 13. The quantum well structure 2 made of the InGaAlAs system is formed as the electro-absorption optical modulator. The quantum well structure 3 made of the InGaAlAs system is formed as the semiconductor laser portion (FIG. 6B). In this case, a stable transverse single mode oscillation suitable for optical communications can be obtained by forming the ridge with a width of about 2 µm.

Then, after forming a silicon oxide film 8 on the entire surface by a thermal CVD method (FIG. 6C), the silicon oxide film 8 is removed only from the top surface of the ridged portion 13 of the semiconductor light emission device and the electro-absorption optical modulator. While the silicon oxide film is used in this embodiment, a silicon nitride film or the like may also be used instead. Then, the wafer is planarized by a polyimide resin 9 in plane with the top surface of the ridged portion 13 on which the silicon oxide film 8 is removed. Then, a p-electrode 10 for the optical modulator and a p-electrode 11 for the semiconductor laser portion are formed. As the electrode materials, known Ti and Au may be successively formed.

Successively, an n-electrode 12 is formed at the rear face of the n-InP substrate 1. As the electrode materials, known AuGe, Ti, and Au may be successively formed in the same manner described above (FIG. 6D).

After forming the electrode, the device is cut out by cleavage. A reflection film with reflectivity of 90% is formed at the rear end surface and a low reflection film with reflectivity of 1% or less is formed at the front end surface by a sputtering method.

According to the method described above, a ridged waveguide type semiconductor optical integrated device in which the EA modulator portion and the DFB laser portion are integrated on one identical substrate can be formed. The order of crystal growth of the EA modulation portion, the waveguide portion, and the DFB laser portion is not limited to this. For example, In the case of forming the DFB laser portion at first, the device structure obtained does not change. With respect to the material for the electro-absorption optical modulator, a quantum well structure may be used, in which the well layer is made of any one of InGaAlAs, InGaAsP, and InGaAs, and the barrier layer is made of either one of InGaAlAs or InAlAs. As the material for the semiconductor laser portion, an InGaAsP system may be used instead of the InGaAlAs system. As the material for the optical waveguide, an InGaAlAs system may be used instead of the InGaAsP system.

The method of crystal growth is not necessarily limited to the MOCVD method and may be formed, for example, using an MBE method. Further, the EA modulation portion, the waveguide portion, and the DFB laser portion may be formed by a single process of the crystal growth by using a selective area growth method. Further, a bent waveguide structure may be used instead of the window structure. Planarization by using the polyimide is not always necessary.

Based on the procedures described above, a method of manufacturing a device in the case where the DFB laser portion is replaced with a structure having other optical functions such as a DBR laser or a SOA can be easily inferred.

Then, an operation method of the ridged waveguide type semiconductor optical integrated device of Embodiment 1 is described. Laser oscillation is obtained by applying a forward bias to the p-electrode 11 of the semiconductor laser portion. In this case, since light is periodically fed back by the diffraction grating 5, the oscillation spectrum is a single mode and the oscillation wavelength is 1550 nm. The laser light passes the optical waveguide 4 and enters the electro-absorption optical modulation portion 2. The laser light is absorbed by applying a reverse bias to the p-electrode 10 of the optical modulation portion. This allows the light to be turned ON and OFF. After light laser passes the electro-absorption optical modulation portion 2, the light laser passes the window structure 6 and goes out to the outside of the device. This can facilitate optical coupling with an optical fiber and suppress the coupling loss to the value of 3 dB or less. The operation current of the semiconductor laser portion was within a range from 70 to 150 mA at a temperature of −5° C. to 85° C. Further, by optimally controlling the voltage applied to the electrode 10 for modulation in accordance with the peripheral temperature of the ridged waveguide type semiconductor optical integrated device of Embodiment 1, a dynamic extinction ratio of 10 dB or more was obtained during the operation at a modulation rate of 10 Gbps. As a result, a favorable eye opening for a transmission distance of 40 km or more at a bit rate of 10 Gbps at a temperature of −5° C. to 85° C. without controlling the temperature was available.

Embodiment 2

BH-EA/DFB (DBR)

Figure 7A:
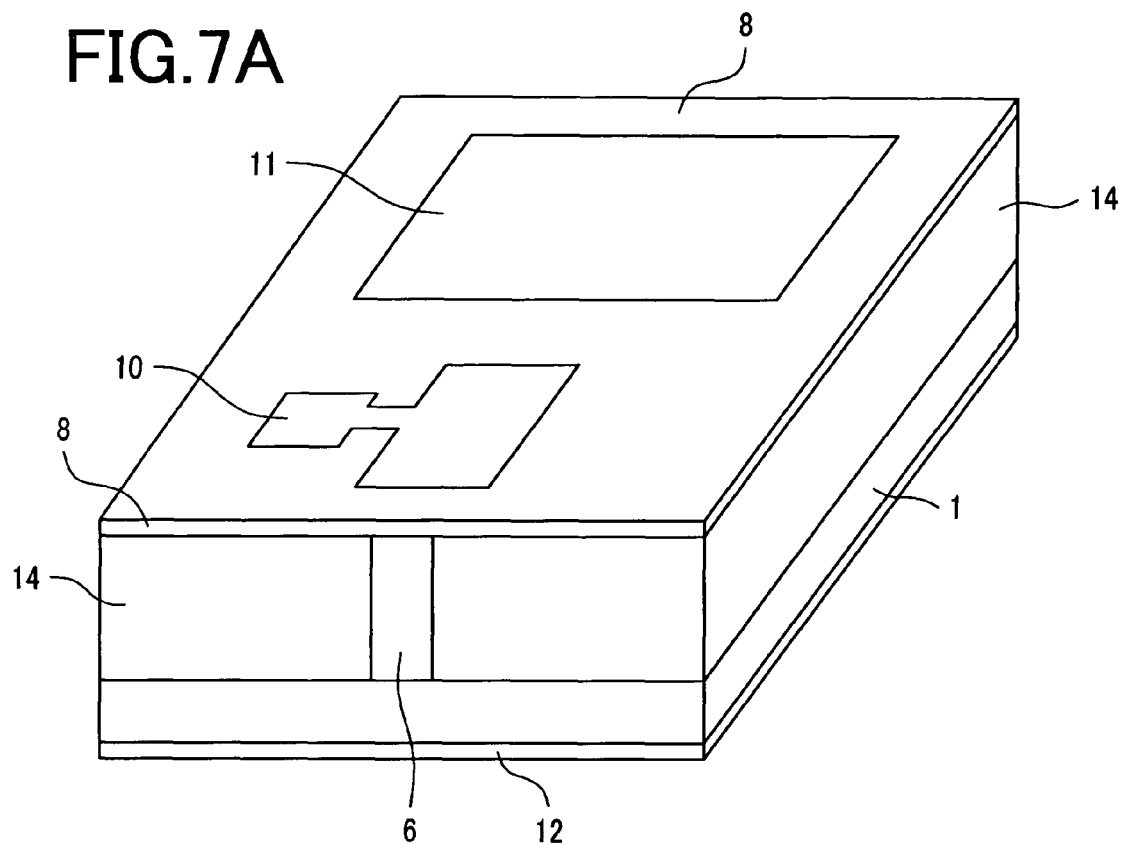
FIG. 7A is a perspective view for the constitution of a semiconductor optical integrated device as a BH structure according to Embodiment 2 of the invention.
Figure 7B:
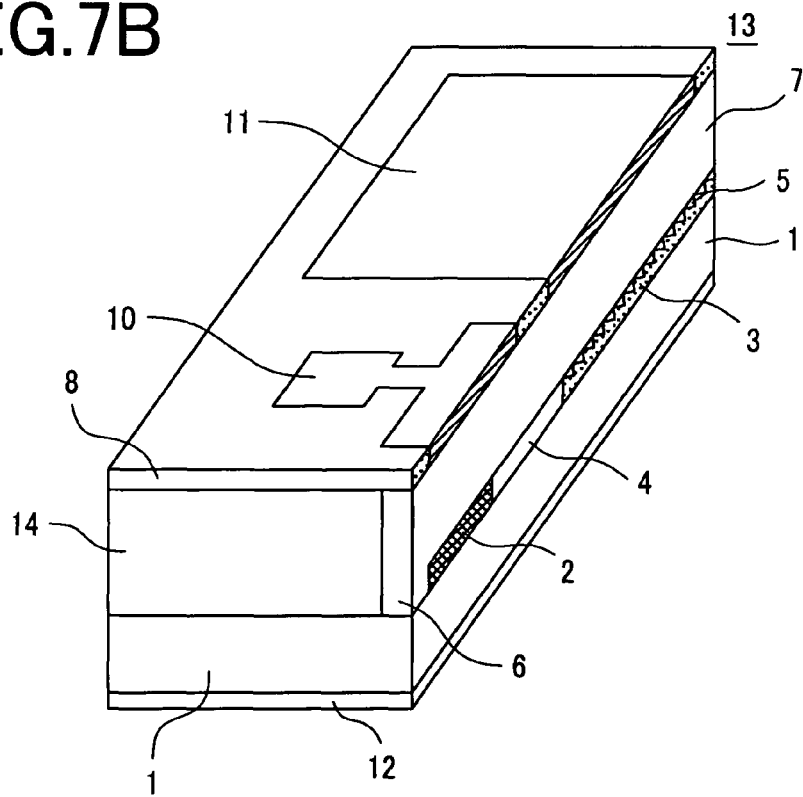
FIG. 7B is a perspective view showing a cross section thereof cut along a central line.

FIG. 7A is a perspective view illustrating a construction according to another embodiment of a semiconductor optical integrated device applied with the present invention. FIG. 7B is a perspective view illustrating a cross section cut along a central line. However, the drawing is only for explaining this embodiment and the size and scale of the drawing showing this embodiment are not necessarily identical.

At first, a quantum well structure 2 made of an InGaAlAs system is formed on an n-InP substrate 1 as an electro-absorption optical modulator using an MOCVD method. In this case, a light emission wavelength of the quantum well structure 2 at a temperature of 25° C. is about 1470 nm. For example, a desired light emission wavelength can be obtained by laminating a quantum well layer with a thickness of 6 nm and with a compositional ratio of In, Ga, and Al at 0.54:0.38:0.08, and a barrier layer with a thickness of 10 nm and with a compositional ratio of In, Ga, and Al at 0.52:0.33:0.15. Further, an optical confinement structure sufficient for extinction can be formed as the quantum well structure by alternately laminating about 10 layers of the quantum wells and the barrier layers. Successively, etching is performed up to the surface of the n-InP substrate 1 while leaving the electro-absorption optical modulator of a desired length. The step is identical with the state shown in FIGS. 5A and 5B.

Then, a quantum well structure 3 made of an InGaAlAs system is formed as a semiconductor laser portion. The light emission wavelength of the quantum well structure 3 at a temperature of 25° C. is about 1540 nm. For example, a desired light emission wavelength can be obtained by forming a quantum well layer with a thickness of 4 nm and with a compositional ratio of In, Ga, and Al at 0.65:0.3:0.05, and a barrier layer with a thickness of 10 nm and with a compositional ratio of In, Ga, and Al at 0.55:0.33:0.12. Further, an optical confinement structure suitable for laser oscillation can be formed by alternately laminating about 8 layers of the quantum wells and the barrier layers. Although not illustrated, a carrier confinement structure suitable for laser oscillation can be formed by sandwiching the quantum well structure 3 by InAlAs bulk growth layers with a thickness of about 100 nm and with a compositional ratio of In and Al at 0.52:0.48.

Etching is performed up to the surface of the n-InP substrate 1 while leaving the semiconductor laser portion of a desired length so as not to influence the electro-absorption optical modulator described above. The step is identical with the state shown in FIGS. 5C and 5D.

Then, an optical waveguide layer 4 made of an InGaAsP system is formed between the electro-absorption optical modulation portion and the semiconductor laser portion. As a detailed structure of the optical waveguide layer, for example, the following structure is desirable: an InGaAsP growth layer with a thickness of 100 nm and with the composition wavelength of 1150 nm is formed, an InGaAsP bulk growth layer with a thickness of 200 nm and with the composition wavelength of 1300 nm, and an InGaAsP bulk growth layer with a thickness of 100 nm and with the composition wavelength of 1150 nm are successively formed. An optical waveguide layer with a small optical loss can be formed by the structure described above. The step is identical with the state shown in FIG. 5D.

Then, a diffraction grating 5 is formed by etching on the quantum well structure 3 made of the InGaAlAs system as the semiconductor laser portion. As the diffraction grating layer, a semiconductor having a higher refractive index than that of InP is desired. For example, an InGaAsP grown layer with a thickness of 30 nm and with the composition wavelength of 1150 nm is suitable. In order to form the diffraction grating, pattern formation applied to a resist by a known technique of holographic exposure method or electron beam drawing method and a wet or dry etching step may be combined. As a specific resist pattern, stripes at a pitch of about 240 nm may be formed in the direction perpendicular to mesa. This can provide a stable longitudinal single mode oscillation suitable for optical communications. The step is identical with the state shown in FIG. 5E.

Then, a portion of the quantum well structure 2 made of the InGaAlAs system, which is formed as the electro-absorption optical modulator, is etched up to the n-InP substrate 1 to form a window structure 6. The step is identical with the state shown in FIG. 5F.

Then, a p-InP layer 7 is formed on the entire surface by an MOCVD method. The step is identical with the state shown in FIG. 6A. Then, etching is performed up to the n-InP substrate 1 to form a ridged portion (high mesa structure) 13. While the state is similar with that in FIG. 6B, the following points are different from FIG. 6B: since etching is performed up to the n-InP substrate 1 in Embodiment 2, the ridged portion 13 is stood upright on the substrate 1, and the window structure 6, the quantum well structure 2, the optical waveguide layer 4, and the quantum well structure 3 formed on the diffraction grating 5 are formed only for the base portion of the ridge portion 13. In this case, a stable transverse single mode oscillation suitable for optical communications is obtained by defining the ridge with a width of about 2 µm.

Then, a semi-insulative InP layer is formed on both sides of the ridged portion 13 by an MOCVD method.

A silicon oxide film 8 is formed on the entire surface by a thermal CVD method. Then, the silicon oxide film 8 is removed only from the ridged portion 13 for the semiconductor light emission device and the electro-absorption optical modulation portion, the p-electrode 10 for the optical modulation portion, and the p-electrode 11 for the semiconductor laser portion. While the silicon oxide film is used in Embodiment 2, a silicon nitride film or the like may also be used instead.

Then, a p-electrode 10 for the optical modulation portion and a p-electrode 11 for the semiconductor laser portion are formed. As the electrode material, known Ti and Au may be formed successively. Then, an n-electrode 12 is formed at the rear face of then-InP substrate 1. As the electrode material, known AuGe, Ti, and Au may be formed successively in the same manner.

After forming the electrode, the device is cut out by cleavage and a reflection film with reflectivity of 90% is formed at the rear end surface and a low reflection film with a reflectivity of 1% or less are formed at the front edge surface by a sputtering method.

According to the method described above, a buried hetero type semiconductor optical integrated device in which the EA modulator portion and the DFB laser portion are integrated on one identical substrate can be formed. The order of crystal growth for the EA modulation portion, the waveguide portion, and the DFB laser portion is not limited to that described above. For example, also in the case of forming the DFB laser portion at first, the obtained device structure does not change. With respect to the material for the electro-absorption optical modulator, it may be a quantum well structure in which the well layer is made of any one of InGaAlAs, InGaAsP, and InGaAs, and the barrier layer is made of either one of InGaAlAs or InAlAs. As the material for the semiconductor laser portion, an InGaAsP system may be used instead of the InGaAlAs system. As the material for the optical waveguide, an InGaAlAs system may also be used instead of the InGaAsP system. Further, the method of crystal growth is not necessarily restricted to the MOCVD method and an MBE method may be used for formation. Further, the EA modulation portion, the waveguide portion and, the DFB laser portion may be formed in one crystal growth step by using a selective area growth method. Further, a bent waveguide structure may also be used instead of the window structure.

According to the procedures described above, a method of manufacturing a device in the case where the DFB laser portion is replaced with a DBR laser, a SOA, or the like may also be inferred easily.

The operation method of the semiconductor optical integrated circuit device according to Embodiment 2 is the same as that in Embodiment 1.

Embodiment 3

RWG-EA/Variable Wavelength LD

Figure 8A:
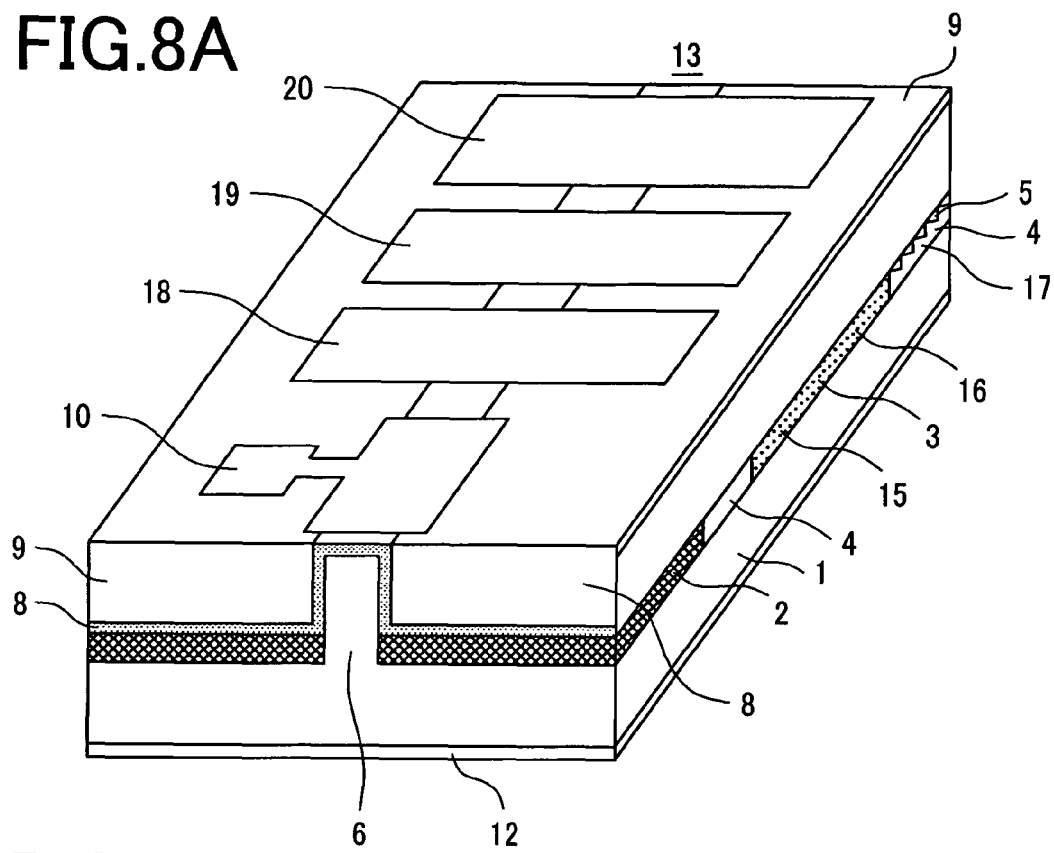
FIG. 8A is a perspective view for the constitution of a semiconductor optical integrated device as a variable wavelength LD according to Embodiment 3 of the present invention.
Figure 8B:
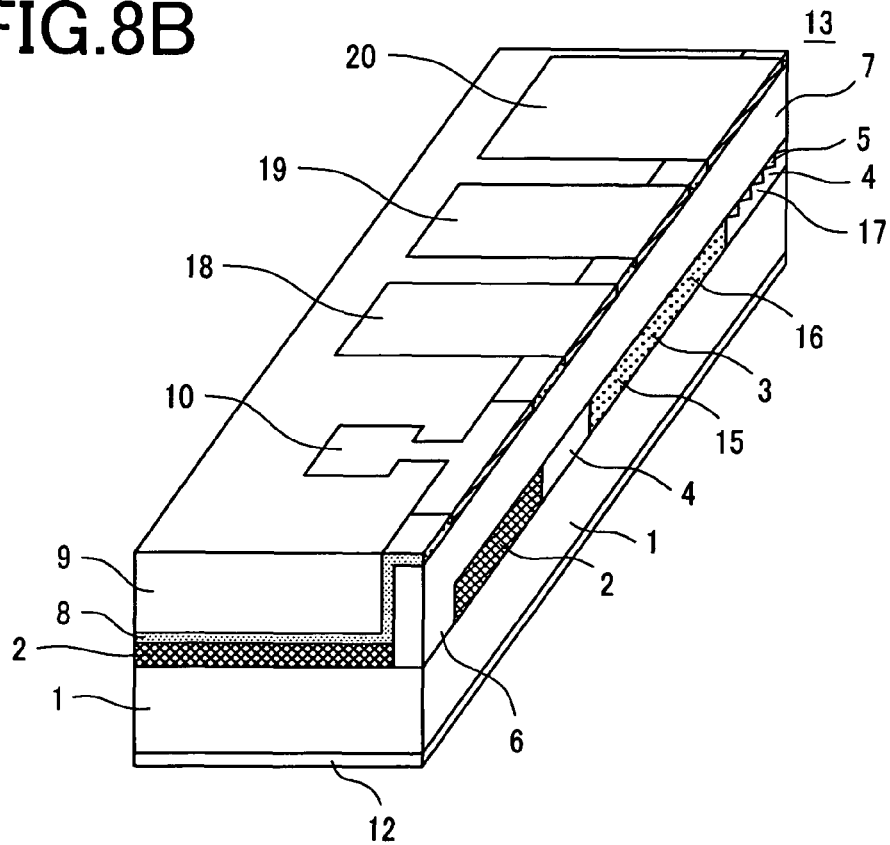
FIG. 8B is a perspective view showing a cross section thereof cut along a central line.

FIG. 8A is a perspective view showing the constitution according to another embodiment of a semiconductor optical integrated device formed as a variable wavelength LD applied to the present invention. FIG. 8B is a perspective view illustrating a cross section cut along a central line. Figures for the processes shown in FIGS. 5 and 6 in Embodiment 1 are not illustrated. However, the drawing is only for the explanation of this embodiment and the size and scale of the drawing showing this embodiment are not necessarily identical.

A quantum well structure 2 made of an InGaAlAs system is formed on an n-InP substrate 1 as an electro-absorption optical modulator using an MOCVD method. In this case, a light emission wavelength of the quantum well structure at a temperature of 25° C. is about 1470 nm. For example, a desired light emission wavelength can be obtained by forming a quantum well layer with a thickness of 6 nm and with a compositional ratio of In, Ga, and Al at 0.54:0.38:0.08, and a barrier layer with a thickness of 10 nm and with a compositional ratio of In, Ga, and Al at 0.52:0.33:0.15. Further, an optical confinement structure sufficient for extinction can be formed as the quantum well structure 2 by alternative laminating about 10 layers of the quantum wells and the barrier layers. Successively, etching is performed up to the surface of the n-InP substrate 1 while leaving the electro-absorption optical modulator of a desired length. The step is the same as the state shown in FIGS. 5A and 5B.

Then, a quantum well structure 3 made of an InGaAlAs system is formed as a semiconductor laser portion. The light emission wavelength of the quantum well structure 3 at a temperature of 25° C. is about 1540 nm. For example, a desired light emission wavelength can be obtained by forming a quantum well with a thickness of 4 nm and with a compositional ratio of In, Ga, and Al at 0.65:0.3:0.05, and a barrier layer with a thickness of 10 nm and with a compositional ratio of In, Ga, and Al at 0.55:0.33:0.12. Further, an optical confinement structure suitable for laser oscillation can be formed by alternately laminating about 7 layers of the quantum wells and the barrier layers. Although not illustrated, a carrier confinement structure suitable for laser oscillation can be formed by sandwiching the quantum well structure 3 between InAlAs bulk growth layers with a thickness of about 100 nm and with a compositional ratio of In and Al at 0.52:0.48.

Successively, etching is performed up to the surface of the n-InP substrate 1 without any influence on the electro-absorption optical modulator described above while leaving the electro-absorption optical modulation portion, an active region 15 and a phase control region 16. The active region 15 and the phase control region 16, each with a desired length, are formed at the quantum well structure 3. The step is the same as the state shown in FIGS. 5C and 5D. In the variable wavelength LD, however, the optical waveguide layer 4 is formed on the side of the phase control region 16. The phase control region 16 with the desired length is formed at the quantum well structure 3. The side of the phase control region 16 is on the opposite side to the electro-absorption optical modulation portion. Thus, etching is performed up to the surface of the n-InP substrate 1 for the predetermined length on the opposite side to the electro-absorption optical modulation portion.

Then, an optical waveguide layer 4 made of an InGaAsP system is formed between the electro-absorption optical modulation portion and the active region 14 with the desired length at the quantum well structure 3 and is formed in the region adjacent with the phase control region 16 with the desired length at the quantum well structure 3. As a detailed structure of the optical waveguide layer 4, it is desired that a structure is formed, for example, by laminating an InGaAsP bulk growth layer with a thickness of 100 nm and with a composition wavelength of 1150 nm, an InGaAsP growth layer with a thickness of 200 nm and with a composition wavelength of 1300 nm, and further laminating an InGaAsP bulk growth layer with a thickness of 100 nm and with a composition wavelength of 1150 nm is desired. With the structure described above, an optical waveguide layer with a small optical loss can be formed.

Then, a diffraction grating 5 is formed by etching in a desired region of the optical waveguide layer 4 made of the InGaAsP system in the region adjacent with the phase control region 15 to form a distributed reflection type region 17. In order to form the diffraction grating, pattern formation to a resist using either a holographic exposure method or an electron beam drawing method, both of which are known techniques, and either of a wet or dry etching step may be combined.

A portion of the quantum well structure 2 is made of the InGaAlAs system and is formed as the electro-absorption optical modulator. The portion of the quantum well structure 2 on the side of light emission edge is etched up to the n-InP substrate 1 in order to form a window structure 6. The step is the same as the state shown in FIG. 5(f).

Then, a p-InP layer 7 is formed by an MOCVD method. The step is the same as the state shown in FIG. 6(a). A ridged waveguide structure 13 is formed by etching the p-InP layer 7 up to the surfaces of the quantum well structure 2, the quantum well structure 3, and the optical waveguide layer 4 except for the portion for forming the ridged waveguide. The quantum well structure 2 is made of the In, Ga, Al, and As systems and is formed as the electro-absorption optical modulator. The quantum well structure 3 is made of the InGaAlAs system and is formed as the semiconductor laser portion. The step is the same as the state shown in FIG. 6(b). A stable transverse single mode oscillation suitable for optical communications can be obtained by defining the ridge with a width of about 2 μm.

A silicon oxide film 8 is formed over the entire surface by a thermal CVD method. The step is the same as the state shown in FIG. 6(c). The silicon oxide film 8 is removed from the ridged portion 13 at the positions corresponding to electrodes 10, 18, 19, and 20. This will be described later. While the silicon oxide film is used in Embodiment 3, a silicon nitride film or the like may also be used instead.

The wafer is planarized at the height of the top surface of the ridge 13 on which the silicon oxide film 8 is removed by a polyimide resin 9. Then, a p-electrode 10 for the optical modulation portion, a p-electrode 17 for the active region, and a p-electrode 18 for the phase control region, and a p-electrode 19 for distributed reflection type region are formed. For the electrode materials, known Ti and Au may be successively formed. Then, an n-electrode 12 is formed to the rear face of the n-InP substrate 1. For the electrode material, known AuGe, Ti, and Au may be successively formed in the same manner.

After forming the electrode, the device is cut out by cleavage. A reflection film with reflectivity of 90% is formed at the rear end surface and a reflection film with a reflectivity of 1% or less is formed to the front end surface by a sputtering method.

According to the method described above, a ridged waveguide type semiconductor optical integrated device in which the EA modulator portion and the variable wavelength laser portion are integrated on one identical substrate can be formed. The order of crystal growth for the EA modulation portion, the waveguide portion, and the tunable wavelength laser portion is not limited to that described above. With respect to the material for the electro-absorption optical modulator, it may be a quantum well structure in which the well layer is made of any one of InGaAlAs, InGaAsP, and InGaAs, and the barrier layer is made of either one of InGaAlAs or InAlAs. For the material for the variable wavelength laser portion, an InGaAsP system may be used instead of the InGaAlAs system. For the material for the optical waveguide, an InGaAlAs system may also be used instead of the InGaAsP system. The method of crystal growth is not necessarily limited to the MOCVD method. For example, an MBE method may be used. Further, the EA modulation portion, the waveguide portion, and the DFB laser portion may be formed in one crystal growth step by using a selective area growth method. Further, a bent waveguide structure may also be used instead of the window structure. Further, the method of manufacturing the buried hetero device may be inferred easily from Embodiments 1 and 2. Further, planarization by the polyimide is not necessarily required.

Then, the operation method of the semiconductor optical integrated device of Embodiment 3 will be described. Laser oscillation is obtained by applying a forward bias to the p-electrode 18 for the active region. In this case, since the light is periodically fed back by the distributed reflection region 17, the oscillation spectrum exhibits a single mode. By supplying current to the p-electrode 20 for the distributed reflection region, Bragg's reflection condition can be changed to change the laser oscillation wavelength. Further, by supplying current to the p-electrode 19 for the phase control region, continuous variable wavelength can be attained without a mode hop.

Also, the light modulation method in Embodiment 3 may be inferred easily from Embodiment 1.

Embodiment 4

Module Using EA/DFB

In an embodiment of a transmitter/receiver module using the semiconductor optical integrated device described in Embodiment 1 and Embodiment 2, the outline of the structure is explained with reference to FIG. 9 and the outline of the control system is explained with reference to FIG. 10. However, the drawings are only for the explanation of this embodiment, and the size and scale of the drawings showing this embodiment do not always identical.

Numeral 21 represents a small-sized optical transmitter module in which a semiconductor optical integrated device 22 formed by integrating a laser portion 31 and an optical modulator 32, both of which support the uncooled operation of the invention, is mounted on an internal substrate 21'. At the top end of the module 21, a lens 25 is maintained by a lens support 25'. The semiconductor optical integrated device 22 and the lens 25 are arranged such that the optical axis of light generated from the laser portion 31 is matched. A thermistor 23 is disposed near the semiconductor optical integrated device 22 on the internal substrate 21' to output a signal for temperature in the module. Behind the semiconductor optical integrated device 22, a monitor photodetector 24 is disposed to detect the optical output due to the backward leak of the laser portion 31. The output from the monitor photodetector 24 is utilized as the operation temperature signal of the laser portion 31. A control device 29 is disposed adjacent with the small-sized optical transmission module 21. The control device 29 is provided with an optical modulator control circuit 33 and an optical laser portion control circuit 34. Lead lines 27 are disposed between the small-sized optical transmission module 21 and the control device 29 to perform a necessary signal transfer between them. Wires 28 are for connection between the lead lines 27 and each of the devices. A high frequency line 26 gives a signal from the optical modulator control circuit 33 to the optical modulator 32. An electric signal in accordance with the intensity of the light incident to the monitor photodetector 24 is sent through the wires 28 and lead wires 27 to the optical laser control circuit 34 on the control device 29. A feedback control is applied to the value of current flowing to the laser portion 31 on the semiconductor optical integrated device 22 so as to obtain a desired optical output.

Figure 1:
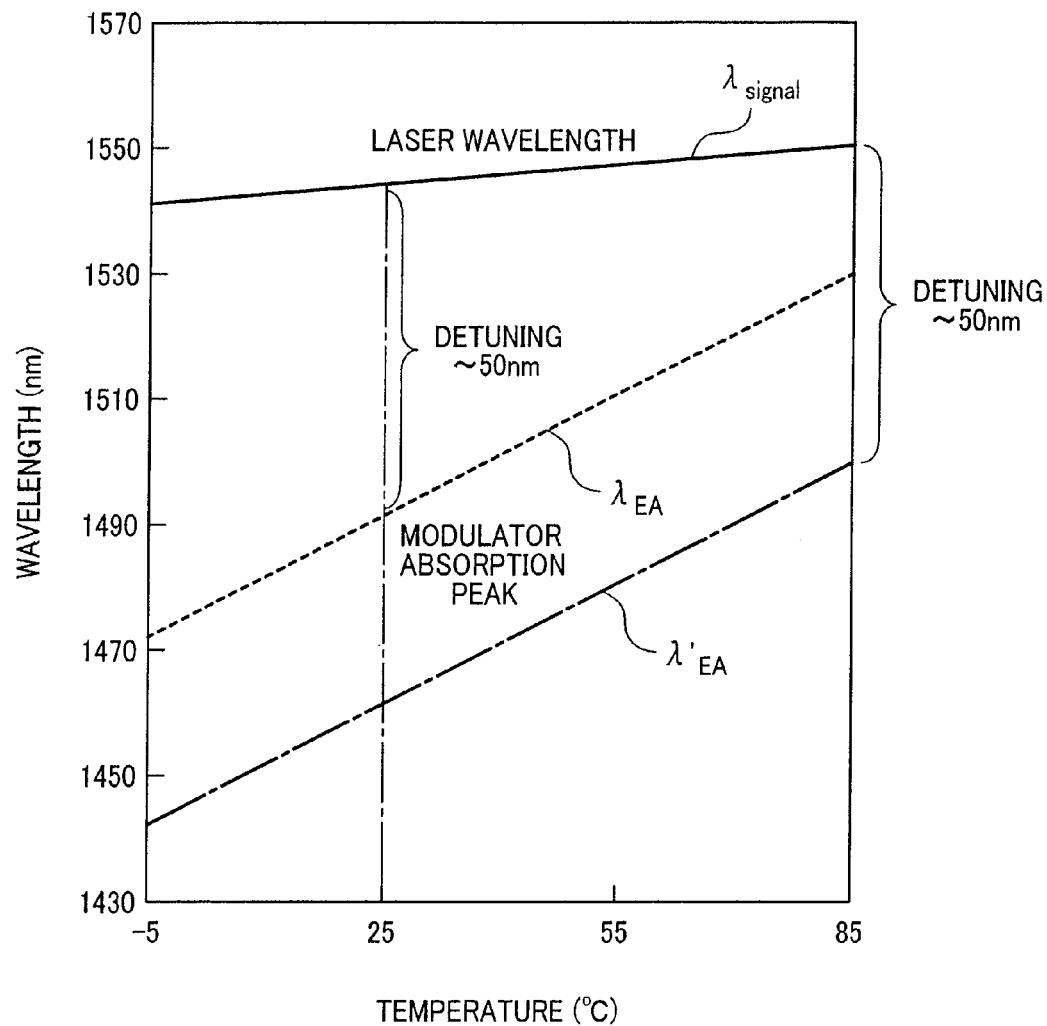
FIG. 1 is a graph showing an embodiment of the temperature dependence of the gain peak wavelength $\lambda_{EA}$ of the EA modulation device and the oscillation wavelength $\lambda_{signal}$ of the DFB laser.
Figure 2:
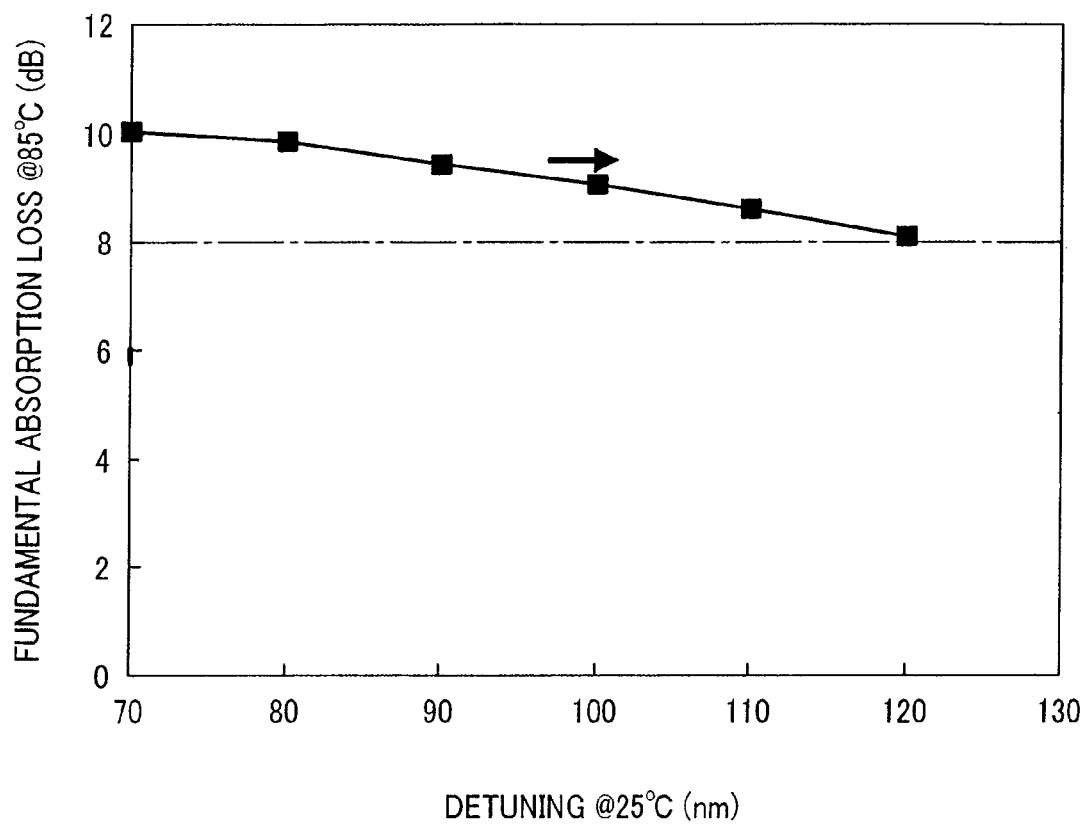
FIG. 2 is a graph showing the dependence of the insertion loss based on the fundamental absorption edge wavelength at a temperature of 85° C. which is the upper limit of the operation temperature (FIG. 2A), and the detuning corresponding to the extinction ratio at a temperature of −5° C. which is the lower limit of the operation temperature in the EA/DFB laser (FIG. 2B).
Figure 2B:
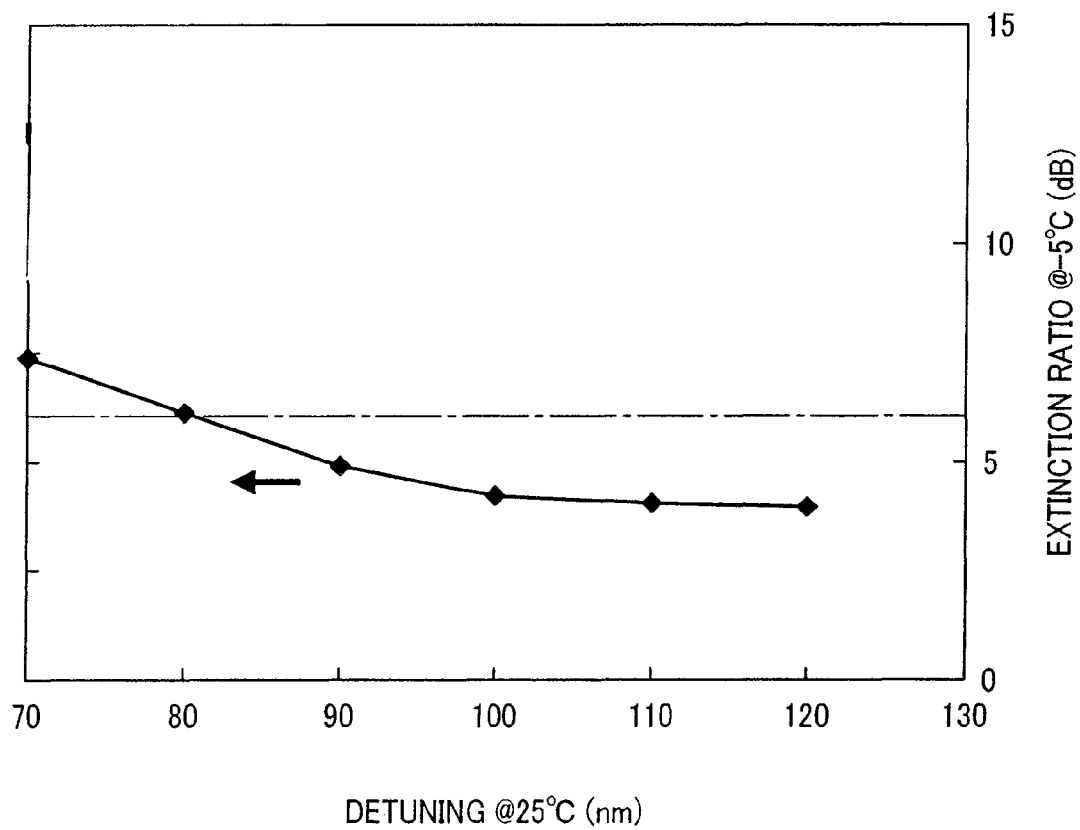
Figure 3:
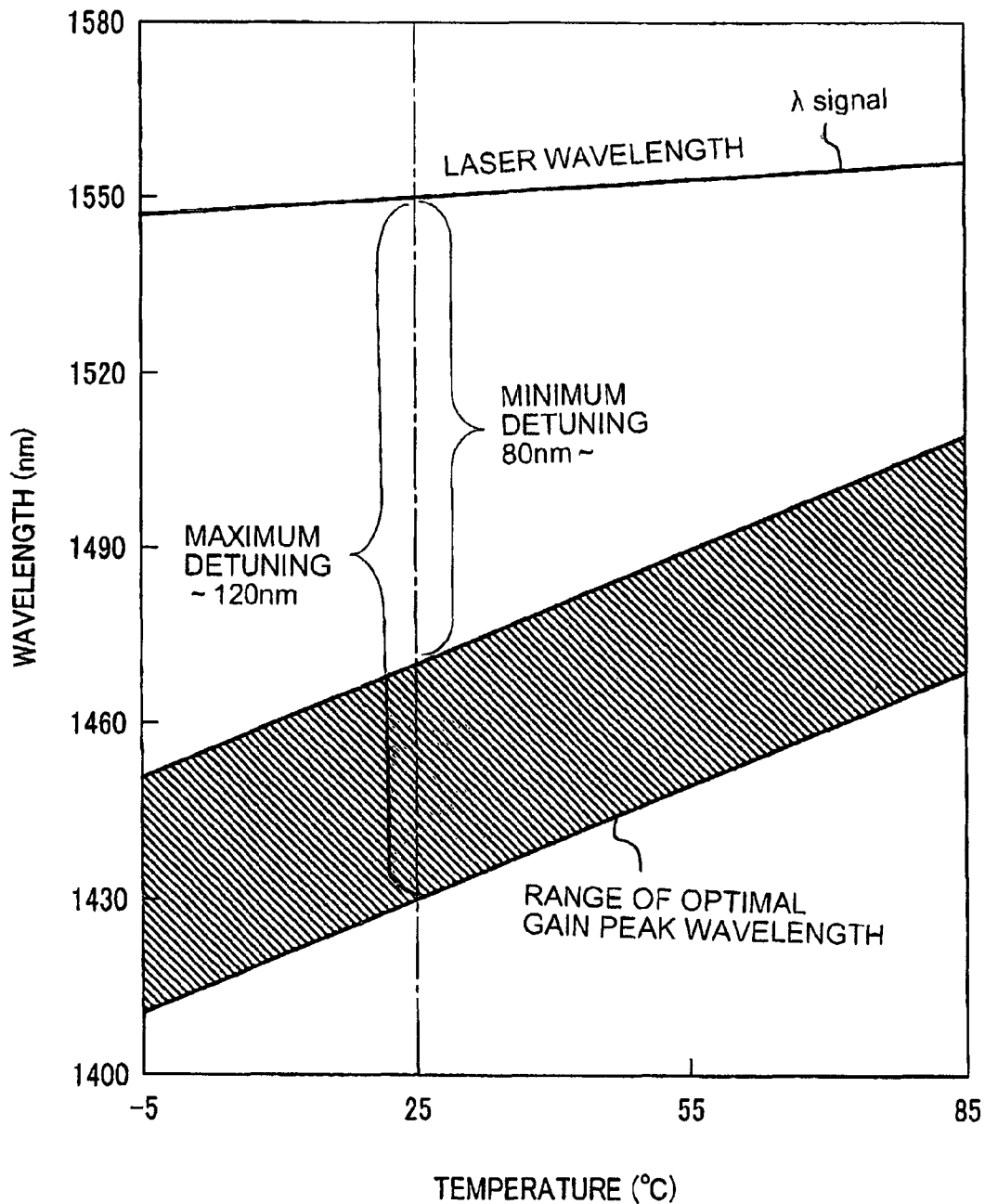
FIG. 3 is a graph showing an embodiment of an optimal range of the gain peak wavelength of the EA modulation device corresponding to a signal light wavelength of a DFB laser proposed in the present invention.

As described above, the temperature in the small-sized optical transmitter module 21 is monitored by the thermistor 23 to control the optical modulator 32. The operation temperature of the laser portion 31 is monitored by the monitor photodetector 24 to control the laser portion 31. Thus, the semiconductor light emitting device which is constituted so as to attain the characteristic shown in FIG. 3 can be used as an optical transmitter which does not require temperature control. While the control circuit and the device constituting the module are connected through the wires and the leads, they may be monolithically integrated on one chip. With this module, a high speed optical signal can be easily produced. This is suitable for reduction in size, reduction in power consumption, and long distance transmission. The variable wavelength semiconductor optical integrated circuit is not explained in FIGS. 9 and 10.

Embodiment 5

Optical Communication System

Figure 9:
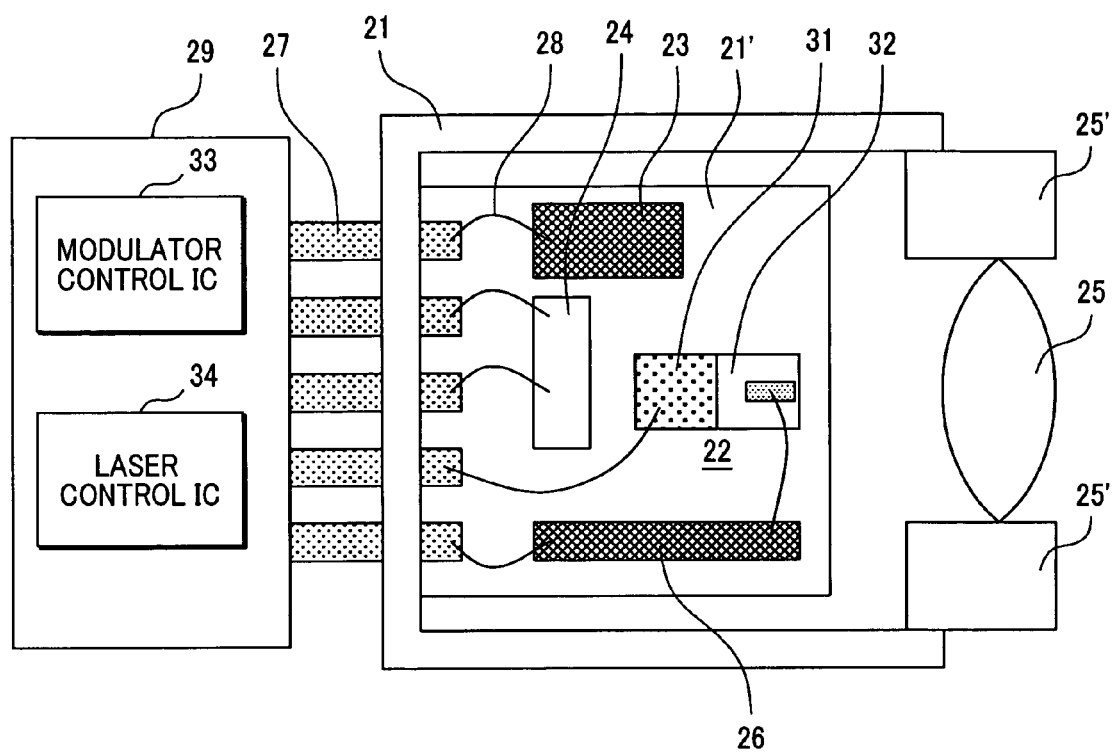
FIG. 9 is a schematic view showing the outline of a structure for an embodiment of a transmission/receiving module using the semiconductor optical integrated device described in Embodiment 1 and Embodiment 2.
Figure 10:
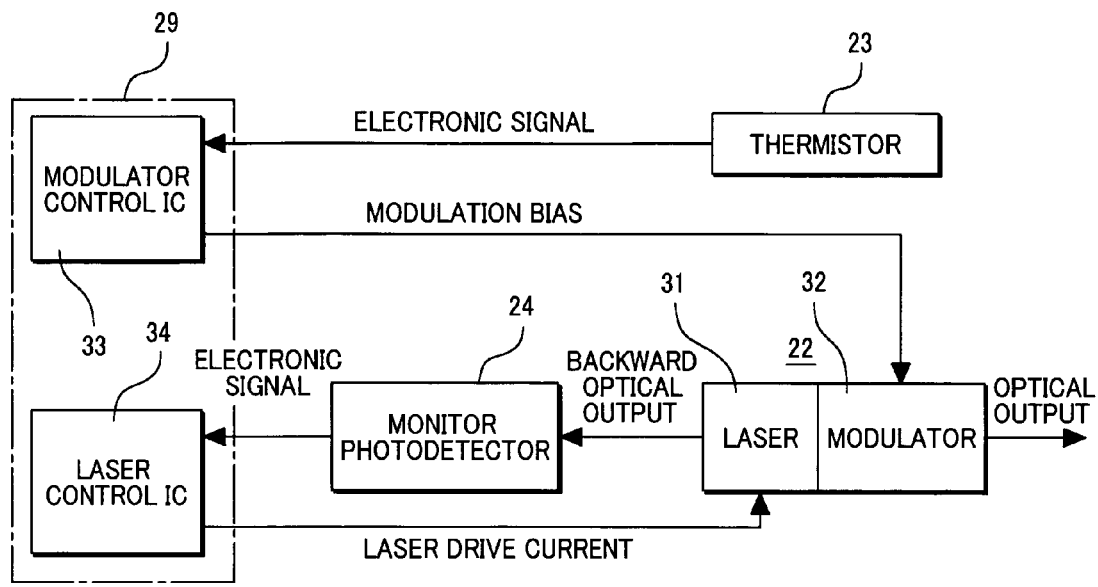
FIG. 10 is a schematic view showing the outline of a control system for an embodiment of a transmission/receiving module using the semiconductor optical integrated device described in Embodiment 1 and Embodiment 2, which is a schematic view showing a fifth embodiment of the present invention.
Figure 11:
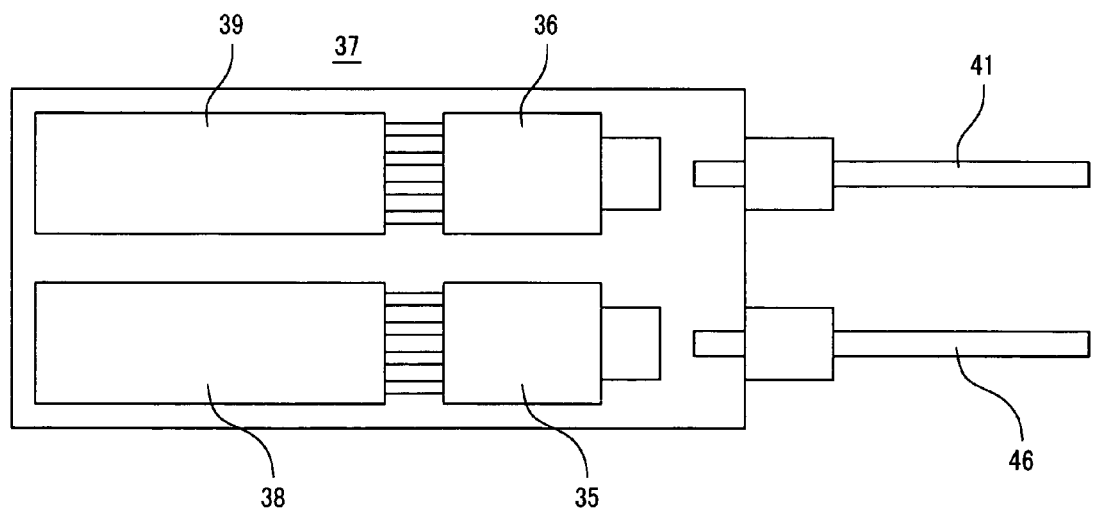
FIG. 11 is a schematic view showing a terminal of an optical communication system constituted by an optical transmitter/receiver package in which an optical transmission module of the present invention shown in FIG. 9 and FIG. 10, and an optical receiving module separately assembled are mounted.

FIG. 11 is a schematic view showing a terminal of an optical communication system constituted by an optical transmitter/receiver package in which an optical transmission module of the present invention shown in FIG. 9 and FIG. 10, and an optical receiving module separately assembled are mounted. Numeral 37 denotes the optical transmitter/receiver package. Numeral 35 denotes an optical transmission module. Numeral 38 denotes an optical transmission module driver circuit. Numeral 36 denotes an optical receiving module. Numeral 39 denotes an optical receiving module driver circuit. Numerals 40 and 41 denote optical fibers which are disposed corresponding to the optical transmission module 35 and the optical receiving module 36, respectively.

What is claimed is:

1. A semiconductor optical integrated device comprising:
a semiconductor substrate having a top surface and a bottom surface;
a semiconductor laser having a signal light wavelength $\lambda_{signal}$ of 1550 nm at a temperature of 25° C., the semiconductor laser being formed on the top surface of the semiconductor substrate;
an electro-absorption optical modulator with a gain peak wavelength $\lambda_{EA}$ having a quantum well structure, applied with an output light of the semiconductor laser, in which a well layer is made of any one of InGaAlAs, InGaAsP, and InGaAs, and a barrier layer is made of either one of InGaAlAs or InAlAs, the electro-absorption optical modulator being formed on the top surface of the semiconductor substrate;
a first electrode formed on the bottom surface of the semiconductor substrate; and
a second electrode formed over the top surface of the semiconductor substrate;
wherein a difference ($E_{EA}-E_{signal}$) between an energy $E_{signal}$ and an energy $E_{EA}$ is 40 meV or more and 70 meV or less, said energy $E_{signal}$ corresponding to the signal light wavelength $\lambda_{signal}$ of the semiconductor laser at a temperature of 25° C., said energy $E_{EA}$ corresponding to the gain peak wavelength $\lambda_{EA}$ of the electro-absorption optical modulator at a temperature of 25° C.

2. A semiconductor optical integrated device according to claim 1, wherein the electro-absorption optical modulator has a quantum well structure, and an energy $E_{barrier}$ is set by using the energy $E_{EA}$ and the energy $E_{signal}$ to:

($E_{signal}$+120 meV)<$E_{barrier}$<($E_{EA}$+350 meV)

said energy $E_{barrier}$ corresponding to the composition wavelength $\lambda_{barrier}$ of the barrier layer of the quantum well structure at a temperature of 25° C., said energy $E_{EA}$ corresponding to the gain peak wavelength $\lambda_{EA}$ of the electro-absorption optical modulator at a temperature of 25° C., said energy $E_{signal}$ corresponding to the signal light wavelength $\lambda_{signal}$ of the semiconductor laser at a temperature of 25° C.

3. The semiconductor optical integrated device according to claim 1,
wherein the semiconductor laser is a distributed feedback type semiconductor laser.

4. The semiconductor optical integrated device according to claim 1,
wherein the semiconductor laser is a distributed reflection type semiconductor laser.

5. The semiconductor optical integrated device according to claim 1,
wherein the semiconductor laser is a variable wavelength semiconductor laser having a variable wavelength function.

6. The semiconductor optical integrated device according to claim 1,
wherein a window structure is formed at the edge of the well layer of the elector-absorption optical modulator.

7. The semiconductor optical integrated device according to claim 1,
wherein the first electrode is an n-electrode and the second electrode is a p-electrode.

8. The semiconductor optical integrated device according to claim 1,
wherein the semiconductor laser contacts the top surface of the semiconductor substrate and the electro-absorption optical modulator contacts the top surface of the semiconductor substrate; and
wherein the first electrode contacts the bottom surface of the semiconductor substrate.

9. The semiconductor optical integrated device according to claim 1,
wherein the semiconductor substrate is a conductive semiconductor substrate; and
wherein the semiconductor laser and the electro-absorption optical modulator are integrated as a semiconductor stack formed on the top surface of the semiconductor substrate.

10. A semiconductor optical integrated device comprising:
a semiconductor substrate having a top surface and a bottom surface;
a semiconductor laser having a signal light wavelength $\lambda_{signal}$, the semiconductor laser being formed on the top surface of the semiconductor substrate;
an electro-absorption optical modulator with a gain peak wavelength $\lambda_{EA}$ having a quantum well structure, applied with an output light of the semiconductor laser, in which a well layer is made of any one of InGaAlAs, InGaAsP, and InGaAs, and a barrier layer is made of either one of InGaAlAs or InAlAs, the electro-absorption optical modulator being formed on the top surface of the semiconductor substrate;
a first electrode formed on the bottom surface of the semiconductor substrate; and
a second electrode formed over the top surface of the semiconductor substrate;
wherein the $\lambda_{signal}$ of the semiconductor laser at a temperature of 25° C. is 1450 nm or more and 1630 nm or less, and the gain peak wavelength $\lambda_{EA}$ of the electro-absorption optical modulator is set such that a difference ($E_{EA}-E_{signal}$) between the energy $E_{signal}$ and the energy $E_{EA}$ is 40 meV or more and 70 meV or less, said energy $E_{signal}$ corresponding to the signal light wavelength $\lambda_{signal}$ of the semiconductor laser at a temperature of 25° C., said energy $E_{EA}$ corresponding to the gain peak wavelength $\lambda_{EA}$ of the electro-absorption optical modulator at a temperature of 25° C.

11. A semiconductor optical integrated device according to claim 10, wherein the electro-absorption optical modulator has a quantum well structure, and the energy $E_{barrier}$ is set by using the energy $E_{EA}$ and the energy $E_{signal}$ to:

($E_{signal}$+120 meV)<$E_{barrier}$<($E_{EA}$+350 meV)

said $E_{barrier}$ corresponding to the composition wavelength $\lambda_{barrier}$ of the barrier layer of the quantum well structure at a temperature of 25° C., said energy $E_{EA}$ corresponding to the gain peak wavelength $\lambda_{EA}$ of the electro-absorption optical modulator at a temperature of 25° C., said energy $E_{signal}$ corresponding to the signal light wavelength $\lambda_{signal}$ of the semiconductor laser at a temperature of 25° C.

12. The semiconductor optical integrated device according to claim 10,
wherein the first electrode is an n-electrode and the second electrode is a p-electrode.

13. A semiconductor optical integrated device disposed in cascade over a semiconductor substrate, the semiconductor optical integrated device comprising:
a semiconductor substrate having a top surface and a bottom surface;
a semiconductor light emission device being formed on the top surface of the semiconductor substrate;
an optical waveguide for passing a light generated by the semiconductor light emission device, the optical waveguide being formed on the top surface of the semiconductor substrate;
an electro-absorption optical modulator for modulating the light passing through the optical waveguide with a given voltage signal, the electro-absorption optical modulator being formed on the top surface of the semiconductor substrate;
a first electrode formed on the bottom surface of the semiconductor substrate; and
a second electrode formed over the top surface of the semiconductor substrate;
wherein the semiconductor light emission device providing with a quantum well structure having an emission wavelength of 1550 nm at a temperature of 25° C., the optical waveguide layer having an optical waveguide layer made of either one of InGaAsP or InGaAlAs, and the electro-absorption optical modulator having a quantum well structure with an emission wavelength of 1470 nm at a temperature of 25° C. are arranged adjacent with each other, and
wherein a multi-quantum well active layer and a waveguide core of the semiconductor light emission device and an optical modulator core layer of the modulator are formed to be situated on a substantially identical plane, and each of the elements has a ridge formed on the respective uppermost layer thereof.

14. The semiconductor optical integrated device according to claim 13,
wherein the first electrode is an n-electrode and the second electrode is a p-electrode.

15. The semiconductor optical integrated device according to claim 13,
wherein the optical waveguide contacts the top surface of the semiconductor substrate, the semiconductor light emission device contacts the top surface of the semiconductor substrate, and the electro-absorption optical modulator contacts the top surface of the semiconductor substrate.

16. The semiconductor optical integrated device according to claim 13,
wherein the optical waveguide is disposed between the semiconductor light emission device and the electro-absorption optical modulator.

17. The semiconductor optical integrated device according to claim 13,
wherein the semiconductor substrate is a conductive semiconductor substrate; and
wherein the optical waveguide, the semiconductor light emission device, and the electro-absorption optical modulator are integrated as a semiconductor stack formed on the top surface of the semiconductor substrate.

18. A semiconductor optical integrated device comprising:
a semiconductor substrate having a top surface and a bottom surface;
a semiconductor light emission device being formed on the top surface of the semiconductor substrate;
an optical waveguide for passing a light generated by the semiconductor light emission device, the optical waveguide being formed on the top surface of the semiconductor substrate;
an electro-absorption optical modulator for modulating the light passing through the optical waveguide with a given voltage signal, the electro-absorption optical modulator being formed on the top surface of the semiconductor substrate;
a first electrode formed on the bottom surface of the semiconductor substrate; and
a second electrode formed over the top surface of the semiconductor substrate;

wherein the semiconductor light emission device providing with a quantum well structure having an emission wavelength of 1550 nm at a temperature of 25° C., the optical waveguide layer having an optical waveguide layer made of either one of InGaAsP or InGaAlAs, and the electro-absorption optical modulator having a quantum well structure with an emission wavelength are arranged adjacent with each other, and wherein a multi-quantum well active layer and a waveguide core of the semiconductor light emission device and an optical modulator core layer of the modulator are formed to be situated on a substantially identical plane, and each of the elements has a ridge formed on the respective uppermost layer thereof; and wherein a difference ($E_{EA}-E_{signal}$) between an energy $E_{signal}$ and an energy $E_{EA}$ is 40 meV or more and 70 meV or less, said energy $E_{signal}$ corresponding to the signal light wavelength $\lambda_{signal}$ of the semiconductor light emission device at a temperature of 25° C., said energy $E_{EA}$ corresponding to the gain peak wavelength $\lambda_{EA}$ of the electro-absorption optical modulator at a temperature of 25° C.

19. The semiconductor optical integrated device according to claim 18, wherein the first electrode is an n-electrode and the second electrode is a p-electrode.

* * * * *